US012625423B2

(12) United States Patent　(10) Patent No.:　US 12,625,423 B2
Wolk et al.　(45) Date of Patent:　May 12, 2026

(54) STRUCTURED FILM AND METHOD OF USING SAME TO FORM A PATTERN ON A SUBSTRATE

(71) Applicant: 3M INNOVATIVE PROPERTIES COMPANY, St. Paul, MN (US)

(72) Inventors: Martin B. Wolk, Woodbury, MN (US); Robert L. Brott, Woodbury, MN (US); Kevin W. Gotrik, Hudson, WI (US); Christopher S. Lyons, St. Paul, MN (US); Caleb T. Nelson, McKinney, TX (US); Vadim Savvateev, St. Paul, MN (US); James M. Nelson, Lino Lakes, MN (US); Craig R. Schardt, Woodbury, MN (US); Jeffrey L. Solomon, Centerville, MN (US); Karl K. Stensvad, Eagan, MN (US); Steven D. Theiss, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 164 days.

(21) Appl. No.: 18/255,695

(22) PCT Filed: Dec. 15, 2021

(86) PCT No.: PCT/IB2021/061796
§ 371 (c)(1),
(2) Date: Jun. 2, 2023

(87) PCT Pub. No.: WO2022/130255
PCT Pub. Date: Jun. 23, 2022

(65) Prior Publication Data
US 2024/0004282 A1　Jan. 4, 2024

Related U.S. Application Data

(60) Provisional application No. 63/127,678, filed on Dec. 18, 2020.

(51) Int. Cl.
*G03F 1/20* (2012.01)
*G03F 7/09* (2006.01)
(Continued)

(52) U.S. Cl.
CPC ................ *G03F 1/20* (2013.01); *G03F 7/094* (2013.01); *G03F 7/36* (2013.01); *G02B 6/02085* (2013.01);
(Continued)

(58) Field of Classification Search
None
See application file for complete search history.

(56) References Cited

U.S. PATENT DOCUMENTS

| | | |
|---|---|---|
| 3,515,778 A | 6/1970 | Fields et al. |
| 4,097,634 A | 6/1978 | Bergh |

(Continued)

FOREIGN PATENT DOCUMENTS

| | | |
|---|---|---|
| EP | 1540716 B1 | 11/2014 |
| JP | 2004358925 A | 12/2004 |

(Continued)

OTHER PUBLICATIONS

Chiniwalla, "Multilayer Planarization of Polymer Dielectics", IEEE Transaction on Advanced Packaging, Feb. 2001, vol. 24, No. 1, pp. 41-53.

(Continued)

*Primary Examiner* — Shamim Ahmed
(74) *Attorney, Agent, or Firm* — Clifton F. Richardson

(57) ABSTRACT

A structured film for forming a pattern on a substrate includes a polymeric support layer, an adhesive layer, an etch resist layer disposed between the polymeric support layer and the adhesive layer, a structured resin layer disposed between the polymeric support layer and the etch resist layer, and one or more unstructured layers disposed (Continued)

between the etch resist layer and the adhesive layer. The structured resin layer has a structured major surface including a plurality of engineered structures. The etch resist layer at least partially fills spaces between adjacent engineered structures to substantially planarize the structured major surface. Methods of using the structured film to form a pattern on a substrate are described.

8 Claims, 12 Drawing Sheets

(51) Int. Cl.
| | | |
|---|---|---|
| *G03F 7/36* | (2006.01) | |
| *G02B 6/02* | (2006.01) | |
| *G03F 7/00* | (2006.01) | |

(52) U.S. Cl.
CPC ........ *G02B 6/02138* (2013.01); *G03F 7/0005* (2013.01)

(56) References Cited

U.S. PATENT DOCUMENTS

| | | | |
|---|---|---|---|
| 5,175,030 | A | 12/1992 | Lu et al. |
| 5,183,597 | A | 2/1993 | Lu |
| 5,639,305 | A | 6/1997 | Brown et al. |
| 5,811,183 | A | 9/1998 | Shaw et al. |
| 6,033,728 | A | 3/2000 | Kikuchi et al. |
| 6,045,864 | A | 4/2000 | Lyons et al. |
| 6,322,236 | B1 | 11/2001 | Campbell et al. |
| 6,682,950 | B2 | 1/2004 | Yang et al. |
| 6,709,883 | B2 | 3/2004 | Yang et al. |
| 6,861,365 | B2 | 3/2005 | Taussig et al. |
| 7,053,419 | B1 | 5/2006 | Camras et al. |
| 7,122,482 | B2 | 10/2006 | Xu et al. |
| 7,328,638 | B2 | 2/2008 | Gardiner et al. |
| 7,350,442 | B2 | 4/2008 | Ehnes et al. |
| 7,521,313 | B2 | 4/2009 | Mei et al. |
| 7,521,727 | B2 | 4/2009 | Khanarian et al. |
| 7,591,903 | B2 | 9/2009 | Maier et al. |
| 7,670,450 | B2 | 3/2010 | Lamansky et al. |
| 7,977,864 | B2 | 7/2011 | Bellmann et al. |
| 8,034,452 | B2 | 10/2011 | Padiyath et al. |
| 8,460,568 | B2 | 6/2013 | David et al. |
| 8,658,248 | B2 | 2/2014 | Anderson et al. |
| 9,415,561 | B2 | 8/2016 | Lindquist et al. |
| 9,780,335 | B2 | 10/2017 | Wolk et al. |
| 10,436,946 | B2 | 10/2019 | Free et al. |
| 2005/0141843 | A1 | 6/2005 | Warden et al. |
| 2007/0065636 | A1 | 3/2007 | Merrill et al. |
| 2012/0064296 | A1 | 3/2012 | Walker, Jr. et al. |
| 2013/0087528 | A1* | 4/2013 | Zhu ........................ C08L 63/00 264/293 |
| 2014/0193612 | A1 | 7/2014 | Yu et al. |
| 2015/0158268 | A1* | 6/2015 | Koike ..................... B32B 27/42 156/247 |

| | | | |
|---|---|---|---|
| 2015/0202834 | A1 | 7/2015 | Free et al. |
| 2015/0214405 | A1 | 7/2015 | Nachtigal et al. |
| 2017/0365818 | A1 | 12/2017 | Wolk et al. |
| 2019/0112711 | A1 | 4/2019 | Lyons et al. |
| 2021/0389503 | A1* | 12/2021 | Wolk ..................... B82Y 40/00 |

FOREIGN PATENT DOCUMENTS

| | | | |
|---|---|---|---|
| JP | 2014080033 | A | 5/2014 |
| WO | 2009002637 | A2 | 12/2008 |
| WO | 2017150261 | A1 | 9/2017 |
| WO | 2019195186 | A1 | 10/2019 |
| WO | 2020095258 | A1 | 5/2020 |
| WO | 2020097319 | A1 | 5/2020 |

OTHER PUBLICATIONS

Chou, "Nanoimprint Lithography", Journal of Vacuum Science & Technology B, 1996, vol. 14, No. 6, pp. 4129-4133.

Colburn, "Step and Flash Imprint Lithography: A New Approach to High-Resolution Patterning", SPIE Conference Proceedings, Emerging Lithographic Technologies III, 1999, vol. 3676, 11 pages.

Huang, "Reversal Imprinting by Transferring Polymer From Mold to Substrate", Journal of Vacuum Science & Technology B, 2002, vol. 20, pp. 2872-2876.

International Search report for PCT International Application No. PCT/IB2021/061796, mailed on Mar. 8, 2022, 4 pages.

Kothari, "Direct Patterning of Robust One-Dimensional, Two-Dimensional, and Three-Dimensional Crystalline Metal Oxide Nanostructures Using Imprint Lithography and Nanoparticle Dispersion Inks" Chemistry of Materials, App 2017, vol. 29, No. 9, pp. 3908-3918.

Kress, "Optical waveguide combiners for AR headsets: features and limitations", Proceedings of SPIE 11062, Digital Optical Technologies, Jul. 2019, vol. 11062, pp. 110620J (1-26).

Kumagai, "Kirchhoff's Thermal Radiation from Lithography-Free Black Metals", Micromachines, 2020, vol. 11, Article 824, pp. 1-13.

Liu, "Diamond turning of high-precision roll-to-roll imprinting molds for fabricating subwavelength gratings", Optical Engineering, Jun. 2016, vol. 55, No. 6, pp. 064105(1-7).

Liu, "Taming the Blackbody with Infrared Metamaterials as Selective Thermal Emitters", Physical Review Letters, Jul. 2011, vol. 107, No. 4, pp. 045901 (1-4).

Matsuno, "Perfect infrared absorber and emitter based on a large-area metasurface", Optical Materials Express, Feb. 2017, vol. 7, No. 2, pp. 618-626.

Miyazaki, "Dual-Band Infrared Metasurface Thermal Emitter for Co2 Sensing", Applied Physics Letters, 2014, vol. 105, pp. 121107/1-121107-4.

Smith, "Employing Step and Flash Imprint Lithography for Gate-Level Patterning of a MOSFET Device," SPIE Conference Proceedings, Emerging Lithographic Technologies VII, Jun. 2003, vol. 5037, pp. 1029-1034.

* cited by examiner

STRUCTURED FILM AND METHOD OF USING SAME TO FORM A PATTERN ON A SUBSTRATE

CROSS REFERENCE TO RELATED APPLICATIONS

This application is a national stage filing under 35 U.S.C. 371 of PCT/IB2021/061796, filed Dec. 15, 2021, which claims the benefit of U.S. Application No. 63/127,678, filed Dec. 18, 2020, the disclosures of which are incorporated by reference in their entirety herein.

BACKGROUND

Structured articles, such as nanostructured articles, are useful for a variety of applications, including optical applications such as optical metasurface applications.

SUMMARY

The present description relates generally to structured films that can be used for forming a pattern on a substrate, to methods of forming a pattern on a substrate using a structured film, and to articles including a structured film disposed on a substrate.

In some aspects of the present description, a structured film for forming a pattern on a substrate is provided. The structured film includes a polymeric support layer, an adhesive layer, an etch resist layer disposed between the polymeric support layer and the adhesive layer, a structured resin layer disposed between the polymeric support layer and the etch resist layer, and one or more unstructured layers having a total thickness of less than 10 microns and disposed between the etch resist layer and the adhesive layer. The structured resin layer has a structured major surface including a plurality of engineered structures. The etch resist layer at least partially fills spaces between adjacent engineered structures to substantially planarize the structured major surface.

In some aspects of the present description, a method of forming a pattern on a substrate is provided. The method can utilize a structured film including a polymeric support layer, one or more unstructured layers, an etch resist layer disposed between the polymeric support layer and the one or more unstructured layers, and a structured resin layer disposed between the polymeric support layer and the etch resist layer. The structured resin layer has a structured major surface including a plurality of engineered structures. The etch resist layer at least partially fills spaces between adjacent engineered structures to substantially planarize the structured major surface and to define an etch resist pattern. The method includes, in sequence, providing the structured film, bonding the structured film to the substrate with the polymeric support layer facing away from the substrate, removing at least the polymeric support layer leaving at least the etch resist layer and the one or more unstructured layers disposed on the substrate, and etching into the one or more unstructured layers to transfer the etch resist pattern to the one or more unstructured layers thereby forming the pattern on the substrate.

In some aspects of the present description, an optical article is provided. The optical article includes a substrate, an optically transparent etch stop layer disposed on the substrate, and a structured film disposed on the etch stop layer. The structured film includes one or more patterned layers and an adhesive layer bonding the one or more patterned layers to the etch stop layer. The structured film includes a plurality of structures defining a plurality of gaps separating adjacent structures. At least some of the gaps extend through the structured film to the etch stop layer.

In some aspects of the present description, an optical article including a waveguide and a structured film disposed on the waveguide is provided. The structured film includes an optical bonding layer bonding the structured film to the waveguide, one or more patterned layers disposed on the optical bonding layer, and an etch stop layer disposed between the one or more patterned layers and the optical bonding layer. The one or more patterned layers are formed by patterning one or more unstructured layers where the one or more unstructured layers have an optical transmittance for substantially normally incident light of at least 50% for at least a first wavelength W1 in a range of 400 nm to 2500 nm. The etch stop layer has an optical transmittance for substantially normally incident light of at least 50% for at least the first wavelength W1. The optical bonding layer has a refractive index having an imaginary part less than 0.01 for at least the first wavelength W1 and has an average thickness greater than 5 nm and less than ¼ W1.

These and other aspects will be apparent from the following detailed description. In no event, however, should this brief summary be construed to limit the claimable subject matter.

DETAILED DESCRIPTION

Figure 1A:
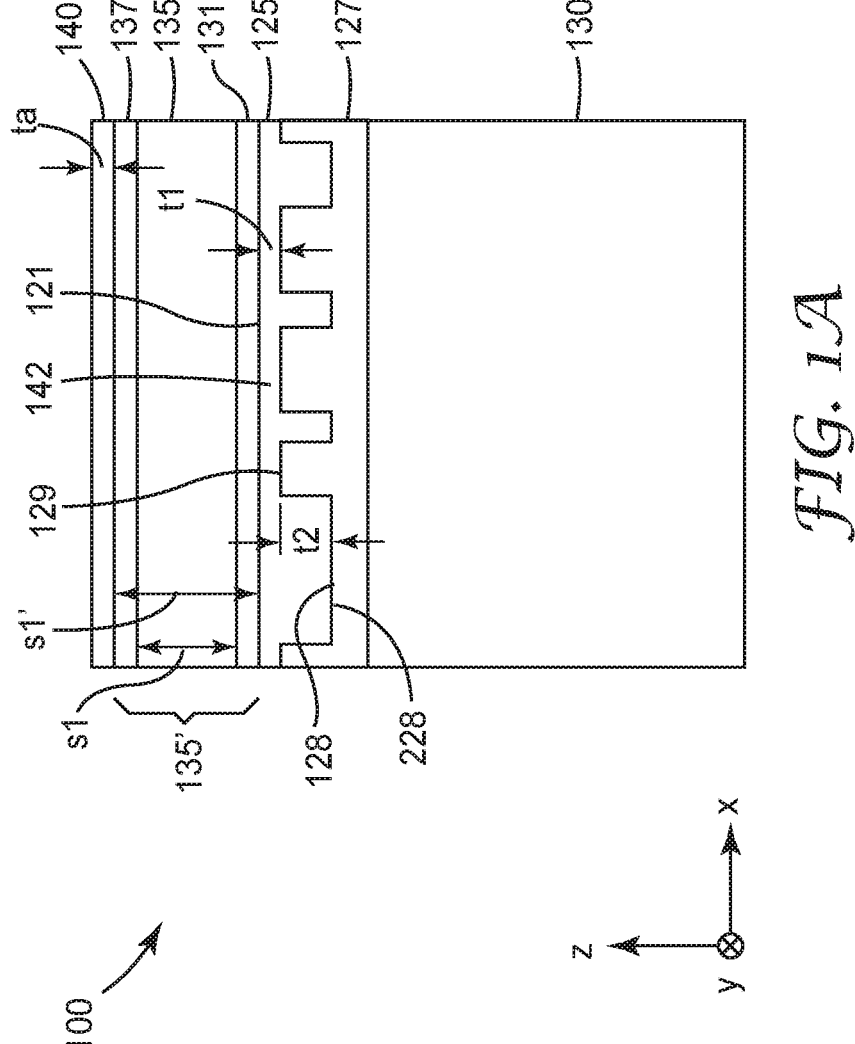
FIGS. 1A-1B are schematic cross-sectional views of structured films, according to some embodiments.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Nanoimprint lithography (NIL) is a method of nanopatterning the surface of an etch wafer in a three-step process. First, a nanoimprint resist is spin coated onto the surface of the etch substrate. Second, the coated resist layer is molded using a nanopatterned template wafer. Finally, the etch wafer with structured resist layer is subjected to a reactive ion etch (RIE) process used to transfer the structure from the resist layer to the etch wafer or a pattern transfer layer on the etch wafer surface. NIL is described in Smith et al., "Employing Step and Flash imprint lithography for gate-level patterning of a MOSFET device," Proc. SPIE 5037, Emerging Lithographic Technologies VII, (16 Jun. 2003); doi: 10.1117/12.490142, for example, and in Imprint lithography, Chapter 11 in Microlithography, D. Resnick and H. Schift, third edition, eds. B. Smith and K. Suzuki, CRC Press, Francis and Taylor, pp. 594-675 (May 21, 2020), ISBN 9781439876756, for example.. Other nanostructured articles are described in International Pat. Appl. Pub. Nos. WO 2020/095258 (Van Lengerich et al.) and WO 2020/097319 (Wolk et al.), for example.

According to some embodiments of the present description, structured films are provided which allow a user of the film to form a patterned layer on a substrate without having to spin coat and mold a resist layer. The structured films may be used in a continuous roll-to-roll or roll-to-plate process to form structures on a substrate substantially more efficiently than traditional NIL batch processes. The structured films may be used to form structures on substrates that are substantially larger than the semiconductor wafer formats used in traditional NIL batch processes or display glass substrates typically used in large format NIL or roll to plate NIL. In some embodiments, the structured film is used to form structures on a region of a substrate where the region has a largest dimension of greater than 100 mm, 200 mm, 300 mm, 450 mm, or 600 nm, for example. In some embodiments, the structured film has a largest dimension of greater than 4 m, or greater than 5 m, or greater than 10 m, or greater than 50 m, or greater than 100 m, for example. In some embodiments, a roll of the structured film is provided. In some embodiments, the roll is converted to sheet form.

The structured film can include a patterned etch resist layer and one or more unstructured layers. The structured film can be bonded to a substrate and then a pattern can be transferred from the etch resist layer via etching into one or more previously unstructured layers to form a pattern on the substrate.

Figure 1B:
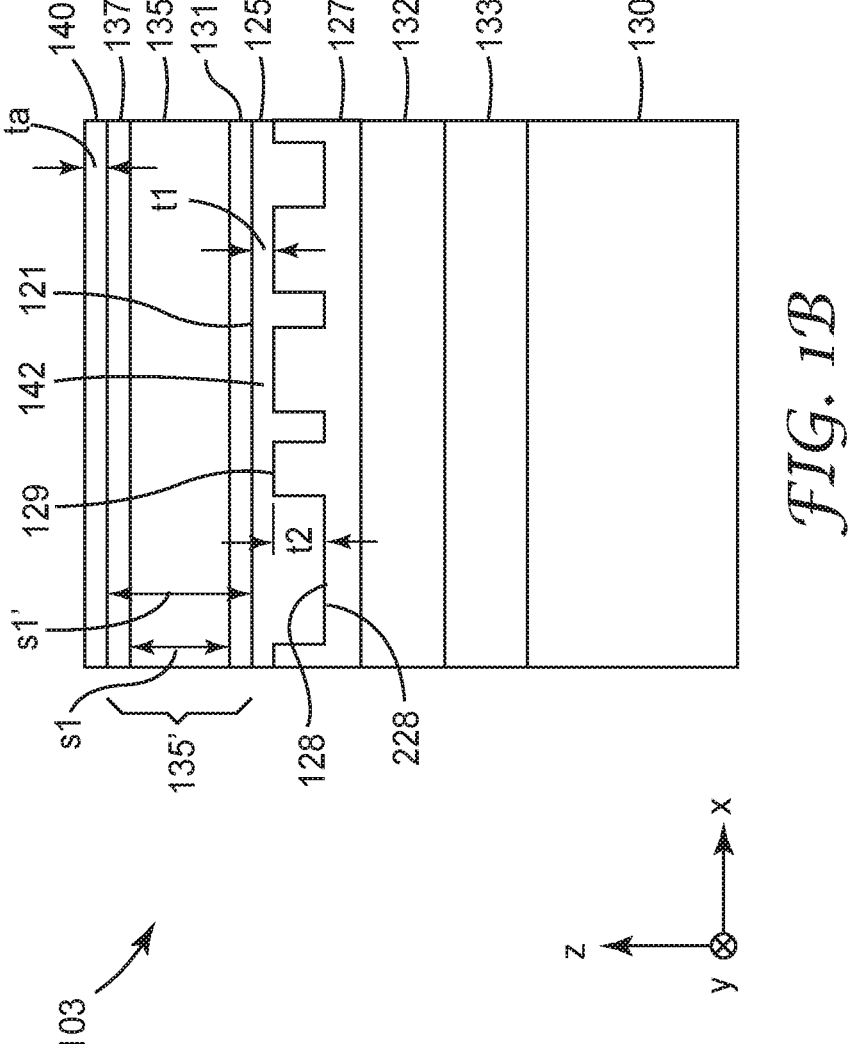
Figure 1C:
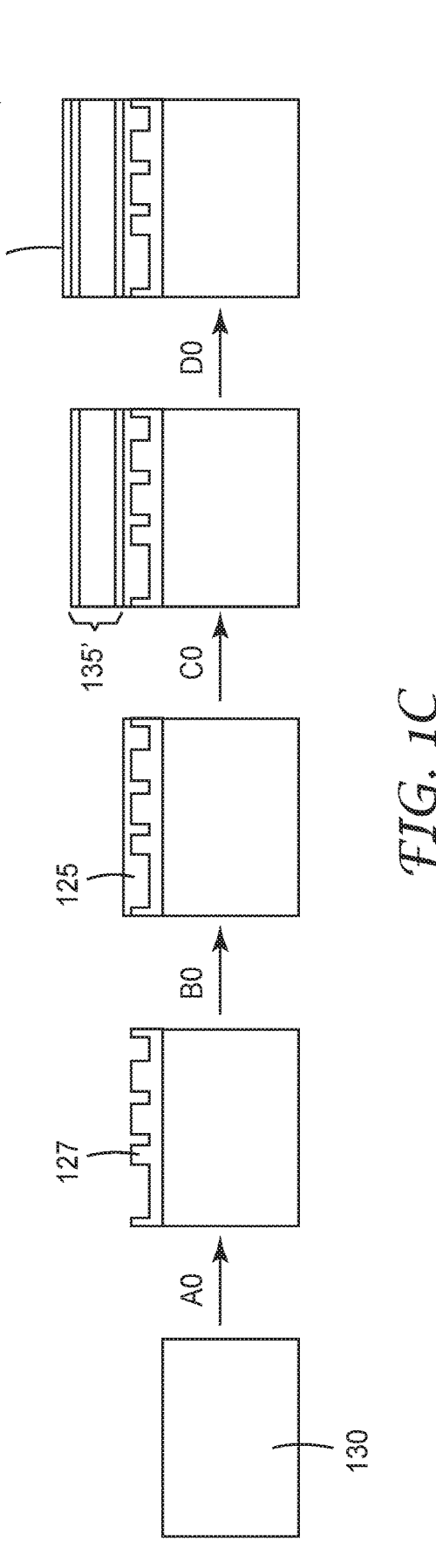
FIG. 1C is a schematic illustration of a method of making the structured film of FIG. 1A.

FIG. 1A is a schematic cross-sectional view of a structured film 100, according to some embodiments. FIG. 1B is a schematic cross-sectional view of a structured film 103, according to some embodiments. FIG. 1C is a schematic illustration of a method of making the structured film 100. The structured film 100 includes a layer 140 for bonding the structured film to a substrate. The layer 140 can be an adhesive layer, such as an optically clear adhesive layer, for example. The structured film 100 includes an etch resist layer 125 and one or more unstructured layers 135 that may be patterned via etching through the etch resist layer 125 after the structured film 100 has been bonded to the substrate (see, e.g., FIG. 2A). In some embodiments, the structured film 100 includes a polymeric support layer 130, an adhesive layer 140, an etch resist layer 125 disposed between the polymeric support layer 130 and the adhesive layer 140, a structured resin layer 127 disposed between the polymeric support layer 130 and the etch resist layer 125, one or more unstructured layers having a total thickness of less than 10 microns and disposed between the etch resist layer 125 and the adhesive layer 140. The one or more unstructured layers may refer to layer(s) 135, which is schematically shown as a single layer in FIG. 1A, but which may include a plurality of layers (see, e.g., layers 135a, 135b illustrated in FIG. 4B), or may refer to layers 135' which includes layers 135, 131 and 137. In some embodiments, layer 131 is a mask layer (e.g., a layer adapted to be patterned such that the patterned layer can be then used as an etch mask for patterning the one or more layers 135). The mask layer may also be referred to as a hard mask layer. In some embodiments, layer 137 is an etch stop layer (e.g. a layer adapted to provide a common etch depth in an etching process).

Layer(s) 135 have a total thickness s1 and layers 135' have a total thickness s1'. In some embodiments, the total thickness of the one or more unstructured layers (e.g., s1 and/or s1') is less than 10 microns, or less than 5 microns, or less than 2 microns, or less than 1 microns, or less than 0.5 microns. In some such embodiments, or in other embodiments, the total thickness is at least 10 nm. In some such embodiments, or in other embodiments, the layer(s) 135 and/or the layers 135' are sufficiently thin that the layer(s) 135 and/or 135' are not self-supporting. A self-supporting layer or layers is a layer or layers that can maintain a shape (e.g., a length and width without the layer(s) folding over and crumpling, for example) and integrity (e.g., no tearing or cracking) during ordinary handling without any additional support layers. The layer(s) 135 and/or 135' may be sufficiently thin that the layer(s) are unable to maintain their shape and/or integrity without additional layer(s) such as the polymeric support layer 130, for example.

The structured resin layer 127 has a structured major surface 128 including a plurality of engineered structures 129. The etch resist layer 125 at least partially fills spaces between adjacent engineered structures 129 to substantially planarize the structured major surface 128 (i.e., to define a substantially planar major surface such as the major surface 121 of the etch resist layer 125). The etch resist layer 125 may have an etch resist pattern 111 (see, e.g., FIG. 2A) defined by the structured major surface 128. The etch resist layer 125 has a major surface 228 facing the structured major surface 128 of the structured resin layer 127. The major surface 228 typically substantially conforms (e.g., deviate from conforming by no more than 20% or no more than 10% of t2) to the structured major surface 128.

In some embodiments, the engineered structures 129 have a length and a width in orthogonal directions (e.g., x- and y-directions), where each direction is orthogonal to the thickness direction (z-direction). In some embodiments, the plurality of engineered structures 129 is or includes a plurality of nanostructures. Nanostructures are structures having at least two orthogonal dimensions (e.g., at least two of height, length and width) in a range of about 1 nm to about 1000 nm. Engineered structures (e.g., engineered nanostructures) are structures deliberately made with a predetermined geometry (e.g., predetermined length, width, and height). Some of the representative shapes of the engineered structures include, but are not limited to, rectangular, triangular and trapezoidal prisms, fins, cylindrical and truncated-cone shaped pillars, and other such shapes. In some embodiments, the engineered structures have an average aspect ratio (height divided by length or width or largest lateral (orthogonal to height) dimension) of at least 0.5, or at least 1, or at least 2, or at least 5, or at least 10, for example. In some embodiments, the engineered structures have non-vertical sidewall angle of at least 1 degree, or at least 2 degrees, or at least 3 degrees. In other embodiments, the engineered structures may have vertical sidewalls. The engineered structures can be placed with regular or irregular (e.g., a pseudo-random distribution where the structures may appear randomly arranged but are formed from an underlying deterministic process) pitch, orientation, and/or shapes, possibly dependent on application functionality and manufacturability.

In some embodiments, the etch resist layer 125 includes a residual layer 142 between a substantially unstructured major surface 121 of the etch resist layer 125 and the plurality of engineered structures 129. The residual layer may be described as the portion of the etch resist layer above the top surfaces (in positive z-direction) of the engineered structures 129. In some embodiments, a ratio of an average (unweighted mean) thickness t1 of the residual layer 142 to an average height t2 of the plurality of engineered structures is less than 1, or less than 0.5, or less than 0.3, or less than 0.25. In some embodiments, t1/t2 is in a range of 0.001 to 0.5, for example. The major surface 121 can be considered to be substantially unstructured when any structures that might be present in the surface has a height substantially smaller than the average height t2 (e.g., less than 20%, or less than 10%, or less than 5%, or less than 3% of the average height t2). The major surface 121 can be considered to be substantially planar when any deviation from planarity on a length scale in a transverse direction (e.g., in the x-y plane) substantially larger than the average height t2 (e.g., 100 times t2 or 1000 times t2) is substantially less than the average height t2 (e.g., less than 20%, or less than 10%, or less than 5%, or less than 3% of the average height t2). In some embodiments, a substantial planarized surface has an amount of planarization (P %) greater than 50%, or more preferably greater than 75%, and most preferably greater than 90%, where the amount of planarization is given by P=(1−(a1/a2))*100%, where a1 is the relief height of a surface layer (e.g., a substantially planarizing layer) and a2 is the feature height of features covered by the surface layer, as further disclosed in P. Chiniwalla, IEEE Trans. Adv. Packaging 24(1), 2001, 41. In some embodiments, the major surface 121 has a surface Ra of less than 30 nm, or less than 20 nm, or less than 10 nm, or less than 5 nm, or less than 2 nm, or less than 1 nm, or less than 0.5 nm.

The layer 140 can have an average thickness in a suitable range for a given application. In some embodiments, the average thickness ta of layer 140 is less than 250 nm, or less than 200 nm, or less than 150 nm, or less than 100 nm, or less than 75 nm, or less than 50 nm, or less than 40 nm, or less than 30 nm. In some such embodiments, or in other embodiments, the average thickness ta is at least 5 nm, or at least 10 nm, or at least 15 nm. In some embodiments, for optical applications, for example, the average thickness ta is chosen to be less than ¼ of a wavelength of interest. For example, for visible light, it may be preferred that the average thickness is less than 100 nm or substantially less than 100 nm (e.g., less than 50 nm) while for near infrared light, the average thickness may be up to 250 nm, for example, or may be even larger when longer wavelengths are of interest. Having a thickness less than ¼ of a wavelength of interest allows the resulting structures which are formed in the one or more unstructured layers to couple to evanescent waves in the substrate, for example. This can allow the resulting structures to be used for light extraction, for example. For applications where coupling to evanescent waves is not of interest, the average thickness ta is not particularly limited and may be in a range of 10 nm to 5 micrometers, for example.

The layer 140 can be a polymeric or monomeric bonding layer and/or may be an optically clear adhesive layer. Suitable optically clear adhesives include those available from Norland Products, Inc. (Cranbury, NJ), for example. Other suitable adhesives include thermosetting materials such as those available from the Dow Chemical Company (Midland, MI) under the CYCLOTENE tradename, for example. Still other suitable adhesives include heat-activated adhesives such as those available from KRATON Polymers (Huston, TX) under the KRATON tradename, for example. Suitable adhesive layers, including thin adhesive layers (e.g., less than 50 nm thick), are described in U.S. Pat. No. 7,521,727 (Khanarian et al.); U.S. Pat. No. 7,053,419 (Camras et al.); U.S. Pat. No. 6,709,883 (Yang et al.); and U.S. Pat. No. 6,682,950 (Yang et al.), for example.

FIG. 1B is a schematic cross-sectional view of a structured film 103 which may correspond to structured film 100 except that an optional additional layer 133 is disposed between the structured resin layer 127 and the polymeric support layer 130 and another optional additional layer 132 is disposed between the polymeric support layer 130 and the structured resin layer. The additional layer 133 may be a dynamic separating layer which may be adapted to facilitate separation of the polymeric support layer 130 and the structured resin layer 127 upon activation (e.g., via irradiation), as described further elsewhere herein. Other structured films described herein (e.g., the structured films schematically illustrated in FIGS. 4A-4B) may optionally include the additional layer 133 and/or the additional layer 132. In some embodiments, the additional layer 133 is included and the additional layer 132 is omitted. In other embodiments, the additional layer 132 is included and the additional layer 133 is omitted.

FIG. 1C is a schematic illustration of a method of making a structured film 100. The method of FIG. 1C may be carried out in a continuous roll-to-roll process, for example. In step A0, the structured resin layer 127 is formed on the polymeric support layer 130. The polymeric support layer 130 can be a polyethylene terephthalate (PET) film or a polycarbonate film, for example, which may be dimensionally stabilized (e.g., heat set). Other suitable materials for the polymeric support layer 130 include other polyesters or co-polyesters, polyurethane, polymethylmethacrylate, polystyrene, polyimide, polyethylene naphthalate, polypropylene, and cyclic olefin copolymers, for example.

The structured resin layer 127 can be formed using different pattern printing, transferring, tiling, copying, or replication technologies, which may include a master mold fabricated via photo-, e-beam, grayscale, 2-photon, or nano-imprint lithographic method; or a micro-contact printing method (μCP), for example. Suitable materials for the structured resin layer 127 include polymerizable compositions, such as those including acrylate or methacrylate components, and thermoplastic materials, such as polymethylmethacrylate, polycarbonate, polypropylene, polyethylene, polystyrene, polyester, or polyamide, for example. Thermoplastic material can be molded to a structured surface of a tool with heat and pressure and firmed by cooling as generally described in U.S. Pat. No. 3,515,778 (Fields et al.) and U.S. Pat. No. 4,097,634 (Bergh), for example. The structured resin layer 127 may be made from a thermoplastic material that flows at a lower temperature than the polymeric support layer 130, for example. In some such embodiments, or in other embodiments, an interface separates the structured resin layer 127 and the polymeric support layer 130. Alternatively, in some embodiments, the structured resin layer 127 and the polymeric support layer 130 could be made from a same thermoplastic material, for example, so that the structured resin layer 127 and polymeric support layer 130 formed a monolithic body. Replication technologies (e.g., nanoreplication) can include casting and curing a resin against a structured surface of a tool, for example. The structured resin layer 127 may be a crosslinked acrylate or methacrylate layer, for example. For example, in some embodiments, the resin is an acrylic resin and curing the resin includes crosslinking the resin. Suitable cast and cure methods, and suitable resins for use with such methods, are described U.S. Pat. No. 5,175,030 (Lu et al.) and U.S. Pat. No. 5,183,597 (Lu) and in U.S. Pat. Appl. Pub. No. 2012/0064296 (Walker, JR. et al.), for example. Other useful methods and/or materials for forming the structured resin layer 127 are described in U.S. Pat. No. 8,658,248 (Anderson et al.); U.S. Pat. No. 5,811,183 (Shaw et al.); and U.S. Pat. No. 6,045,864 (Lyons et al.), for example. The structured tool may be fabricated using any suitable fabrication method, such as by photolithography or e-beam lithography to prepare a tooling master, a metal copy thereof, a polymer copy of either a tooling master or a metal copy thereof, a polymer copy of such a polymer copy, a directly written tool or any copy thereof, a copy of a structured liner or any copy thereof. Suitable fabrication methods are described in International Appl. Pub. No. WO 2009/002637 (Zhang et al.) and U.S. Pat. Appl. Pub. Nos. 2007/0065636 (Merrill et al.) and 2014/0193612 (Yu et al.); and U.S. Pat. No. 8,460,568 (David et al.), for example. The tool may be made via diamond turning for example. Exemplary diamond turning systems and methods are described in U.S. Pat. No. 7,350,442 (Ehnes et al.); U.S. Pat. No. 7,328,638 (Gardiner et al.), and U.S. Pat. No. 6,322,236 (Campbell et al.), for example. An example of patterning sub-wavelength gratings can be found in Chun-Wei Liu, Jiwang Yan, Shih-Chieh Lin, "Diamond turning of high-precision roll-to-roll imprinting molds for fabricating subwavelength gratings," Opt. Eng. 55(6), 064105 (2016), doi: 10.1117/1. OE.55.6.064105.).

In step B0, the etch resist layer 125 is disposed (e.g., via coating) on the structured resin layer. In step C0, the layers 135' are deposited on the etch resist layer 125. In step D0, the adhesive layer 140 is disposed (e.g., via coating) on the layers 135'. The mask layer 131, the etch stop layer 137, and the layer(s) 135, may be deposited using a variety of deposition methods considering the material type the layer thickness. Suitable deposition methods may include a chemical vapor deposition (CVD) method, a sputter coating method, a physical vapor deposition (PVD) method, an atomic layer deposition (ALD) method, or a combination thereof, for example. A thin layer or film can be coated onto a flat or structured surface using coating methods known in the art such as slot die coating, slide coating, curtain coating, knife coating, blade coating, dip coating, and spin coating. Slot die coating equipment is described in U.S. Pat. No. 5,639,305 (Brown et al.) and U.S. Pat. No. 7,591,903 (Maier et al.), for example. A spin coater is described in U.S. Pat. No. 6,033,728 (Kikuchi et al.), for example.

Figure 2A:
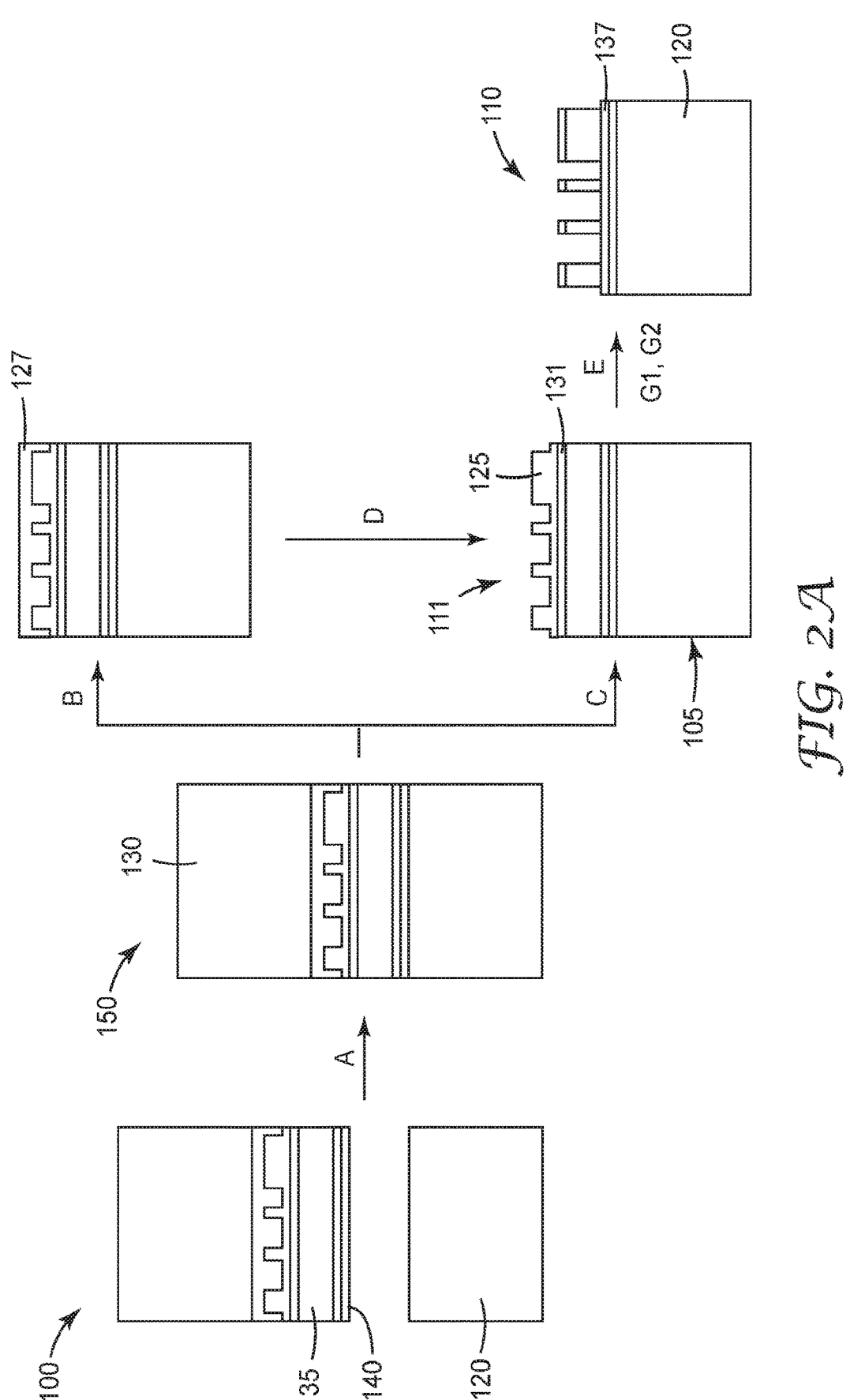
FIGS. 2A-2B schematically illustrate methods of forming a pattern on a substrate.
Figure 2B:
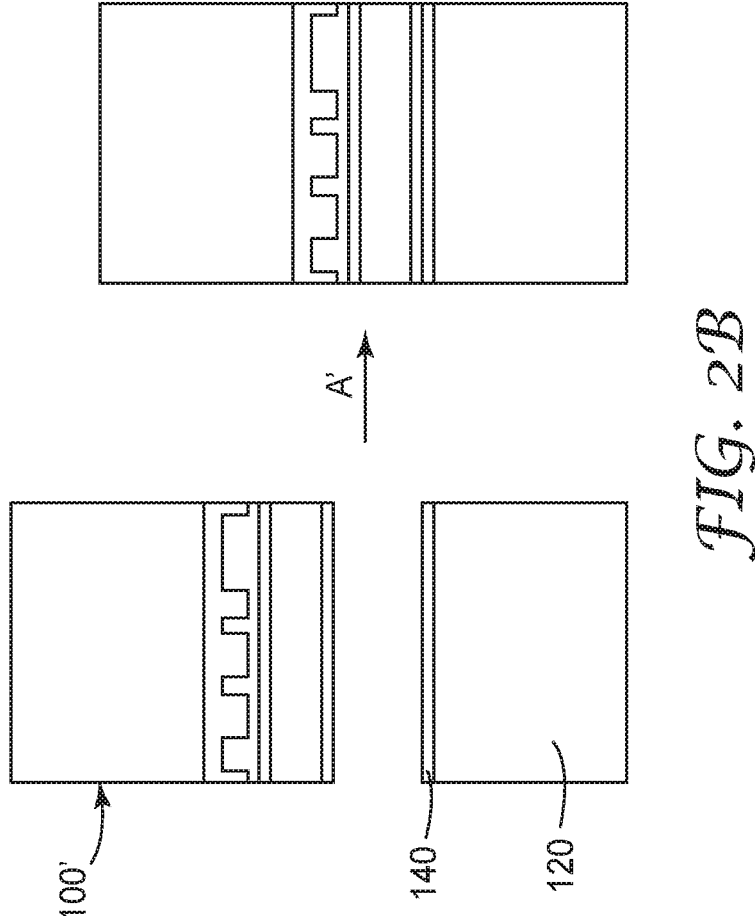

In some embodiments, the structured film 100 or 100' (see, e.g., FIG. 2B) or other structured films described herein includes a polymeric support layer 130, one or more unstructured layers 135 or 135', an etch resist layer 125 disposed between the polymeric support layer 130 and the one or more unstructured layers, and a structured resin layer 127 disposed between the polymeric support layer 130 and the etch resist layer 125, where the structured resin layer 127 has a structured major surface 128 including a plurality of engineered structures and where the etch resist layer 125 at least partially fills spaces between adjacent engineered structures to substantially planarize the structured major surface 128 and to define an etch resist pattern 111 (see, e.g., FIG. 2A). The structured film 100 or 100' or other structured films described herein can be used for forming a pattern 110 on a substrate 120 as schematically illustrated in FIGS. 2A-2B. In some embodiments, the method includes, in sequence, providing a structured film 100 or 100', bonding the structured film to the substrate 120 (e.g., adhering the structured film to the substrate with an adhesive layer 140) such that the polymeric support layer 130 faces away from the substrate (step A in FIG. 2A or step A' in FIG. 2B), removing at least the polymeric support layer 130 leaving at least the etch resist layer 125 and the one or more unstructured layers 135 or 135' disposed on the substrate 120 (step B or C), and etching into the one or more unstructured layers to transfer the etch resist pattern 111 to the one or more unstructured layers thereby forming the pattern 110 on the substrate 120 (step E). In some embodiments, as schematically illustrated in FIGS. 1A-1B and 2A, for example, the structured film includes an adhesive layer 140 disposed on the one or more unstructured layers. In some embodiments, as schematically illustrated in FIG. 2B, for example, bonding the structured film 100' to the substrate 120 includes disposing an adhesive layer 140 on the substrate 120 and then disposing the structured film 100' on the adhesive layer 140.

In some embodiments, the etch resist pattern 111 and the pattern 110 on the substrate 120 have a substantially same geometry (e.g., each of the length, width and thickness of the structures of the etch resist pattern 111 can be within 20%, or within 10% of the respective length, width and thickness of the structures of the pattern 110). In other embodiments, the etch resist pattern 111 and the pattern 110 on the substrate 120 have a substantially same pattern in top plan view (e.g., each of the length and width of the structures of the etch resist pattern 111 can be within 20%, or within 10% of the respective length and width of the structures of the pattern 110), but may have different thickness or heights which may be adjusted by etch conditions, for example In some embodiments, the structured resin layer 127 is releasably attached to the polymeric support layer 130 or to the etch resist layer 125. In some embodiments, the structured resin layer 127 is permanently attached to the etch resist layer 125 and releasably attached to the polymeric support layer 130. This is schematically illustrated in step B of FIG. 2A. In this case, the method of using the structured film 100 or 100' or other structured film for forming a pattern 110 on a substrate 120 may include the step (step D) of etching (e.g., reactive ion etching) the structured resin layer 127 to expose etch resist pattern 111 of the etch resist layer 125. In some embodiments, the structured resin layer 127 is releasably attached to the etch resist layer 125 and permanently attached to the polymeric support layer 130. This is schematically illustrated in step C of FIG. 2A. Step C or step D of FIG. 2A results in article 105 which includes the etch resist layer 125 and includes the one or more unstructured layers 135 disposed between the etch resist layer 125 and the substrate 120 with the adhesive layer 140 bonding the one or more unstructured layers 135 to the substrate 120.

Two layers are releasably attached to one another when the layers can be separated from one another with little or no damage to either layer (e.g., sufficiently little damage that the damage is not readily visible to the unaided eye of a person with 20/20 vision). First and second layers being releasably attached to one another includes the case where a third layer (and optionally additional layers) is disposed between the first and second layers where the third layer is adapted facilitate the separation of the first and second layers (e.g., the third layer may be adapted to split apart or to separate from at least one of the first and second layers). The third layer may be adapted to facilitate the separation of the first and second layers only after activation (e.g., via irradiation or chemical activation or thermal activation) of the third layer. For example, the third layer may be a dynamic separating layer. A dynamic separating layer is a layer that can be changed from a first state to at least a second state (e.g., by activating the separating layer via irradiation) where the layer provides a higher adhesion to at least one adjacent layer in the first state and a lower adhesion to the at least one adjacent layer in the second state. For example, a dynamic separating layer can be a photo-induced stress mode release layer (e.g., a polymeric layer that can be crosslinked or further crosslinked upon irradiation such that the increase in crosslinking generates stress which facilitates release from adjacent layer(s)) and/or a light-to-heat conversion (LTHC) layer. A dynamic separating layer may include a plurality of sublayers. Suitable dynamic separating layers include carbon black nanocomposites, thin optically absorbing metal (e.g., aluminum, titanium, or chromium) layers, and light absorbing optical cavities such as those defined by thin (e.g., 10 to 30 nm) metal (e.g., aluminum, titanium, or chromium) layers separated by a polymeric layer such as an acrylate layer. A dynamic separating layer can be formed from 3M Light-To-Heat Conversion Release Coating (LTHC) Ink (available from 3M Company, St. Paul, MN), for example. Other suitable dynamic separating layers include the LTHC layers described in U.S. Pat. No. 7,977,864 (Bellmann et al.) and U.S. Pat. No. 7,670,450 (Lamansky et al.), for example. The dynamic separating layer may include soluble near-infrared (NIR) dyes such as those available from H.W. Sands Corp. (Jupiter, FL).

The layer 133 schematically illustrated in FIG. 1B may be a dynamic separating layer. In some embodiments, an optional additional polymeric layer 132 is disposed between the layer 133 and the structured resin layer 127. The layer 133 can be a dynamic separating layer adapted to be releasably attached to the additional substrate layer 132 upon activation. In this case, the dynamic separating layer 133 may be described as being adapted to facilitate separation of the polymeric support layer 130 and the structured resin layer 127 upon activation by facilitating separation at a parting interface between the dynamic separating layer 133 and the additional polymeric layer 132. The structured film can be configured such that the structured resin layer 127 is releasably attached to the polymeric support layer 130 by including a parting layer between the structured resin layer 127 and the polymeric support layer 130, or by including a dynamic separating layer 133 (e.g., an LTHC layer) between the structured resin layer 127 and the polymeric support layer 130 and activating the dynamic separating layer (e.g., irradiating an LTHC layer). The radiation can include one or more wavelengths, including visible, infrared, or ultraviolet radiation, from a laser, lamp, or other radiation source. Useful radiation conditions are described in U.S. Pat. No. 7,977,864 (Bellmann et al.), for example. The parting layer is a static separating layer that can be a low surface energy layer, for example, or can be a layer coextruded with the polymeric support layer 130 and weakly adhered to the polymeric support layer 130 as generally described in U.S. Pat. No. 9,415,561 (Lindquist et al.), for example. For example, in some embodiments, the layer 133 in FIG. 1B is omitted and the layer 132 is a parting layer coextruded with the polymeric support layer 130. Without a parting layer or dynamic separating layer, the structured resin layer 127 may be permanently attached to the polymeric support layer 130. The structured film can be configured such that the structured resin layer 127 is releasably attached to the etch resist layer 125 by release treatment of the structured major surface 128 with a low surface energy material, by plasma induced fluorination of the structured resin layer 127, or by formulation of the etch resist layer 125 (e.g., with the addition of a silicone component) to promote poor adhesion to the structured resin layer 127, for example. Without such treatments or additives, the structured resin layer 127 may be permanently attached to the etch resist layer 125.

In some embodiments, the structured film 100, 100' or other structured film described herein includes a mask layer 131 disposed between the etch resist layer 125 and the one or more unstructured layers 135. In some such embodiments, or in other embodiments, the structured film 100, 100' or other structured film includes an etch stop layer 137 disposed on the one or more unstructured layers 135 (e.g., opposite the mask layer 131 and/or between the one or more unstructured layers 135 and the adhesive layer 140).

Figures 3A, 3B, 3C:
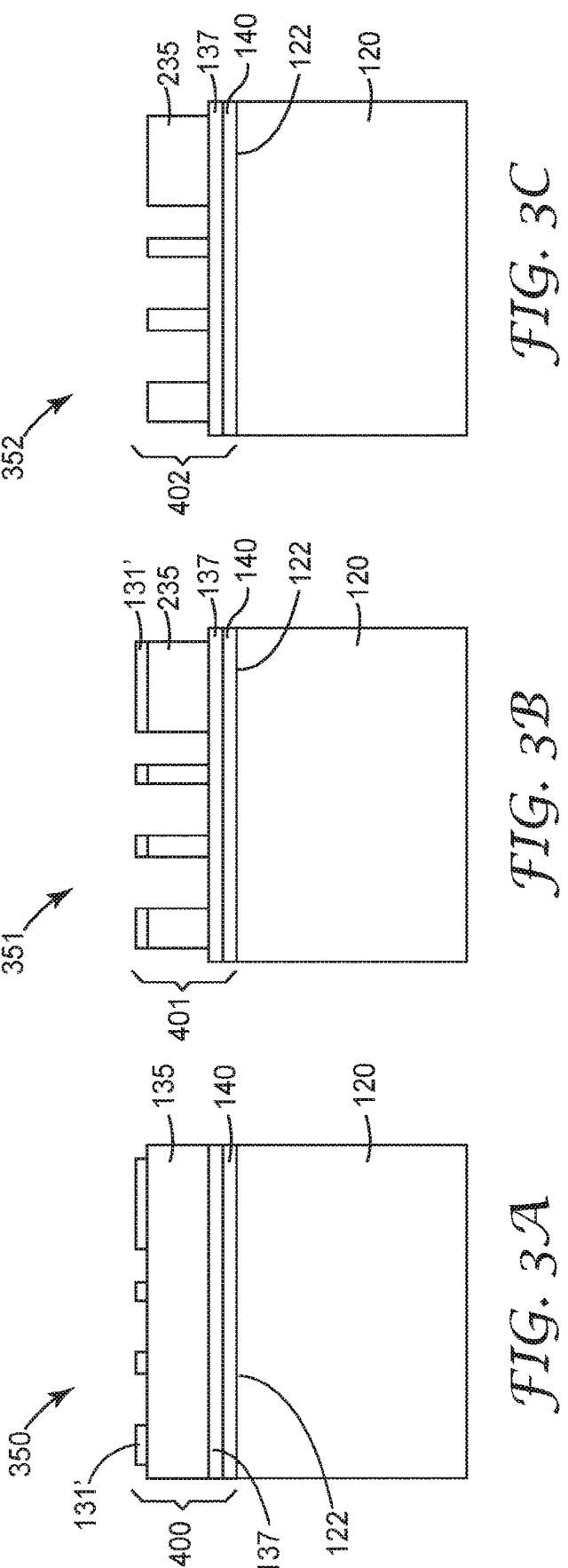
FIGS. 3A-3C are schematic cross-sectional views of articles that can be formed using a structured film, according to some embodiments.

FIGS. 3A-3C are schematic cross-sectional views of articles 350-352, respectively, that can be formed via etching article 105 schematically illustrated in FIG. 2A or, for article 352, via etching an article corresponding to article 105 except without the mask layer 131. In some embodiments, etching into the one or more unstructured layers 135 includes etching portions of the mask layer 131 through the etch resist layer 125 in a first etching step to form a patterned mask layer 131', and etching into the one or more unstructured layers 135 through the patterned mask layer 131' in a second etching step to form the pattern 110 on the substrate 120. For example, the method step E of FIG. 2A can include forming the patterned mask layer 131' of FIG. 3A by etching through the etch resist layer 125 in a first etching step (resulting in article 350) and then etching into the one or more unstructured layers 135 through the patterned mask layer 131' in a second etching step (thereby patterning layer 135 resulting in patterned layer 235 and article 351). In some embodiments, etching into the one or more unstructured layers 135 includes etching through the one or more unstructured layers 135 to the etch stop layer 137 (see, e.g., FIGS. 3B-3C). In some embodiments, the mask layer 131 is omitted and etching into the one or more unstructured layers 135 includes etching through the etch resist layer 125 into the one or more unstructured layers 135 (see, e.g., FIG. 3C). For example, the mask layer 131 may be omitted when relatively low aspect ratio structures are desired, for example, in which case the etch resist layer 125 can serve as the etch mask for etching into the one or more unstructured layers 135. Alternatively, the article 352 may be formed from the article 351 via a subsequent etch step to remove the patterned mask layer 131'. The articles 350, 351 and 352 schematically illustrated in FIGS. 3A-3C, respectively, include structured films 400, 402, 402, respectively, disposed on a substrate 120. Structured film 400 includes a patterned layer 131' and unpatterned layers 137 and 140. Structured film 401 includes patterned layers 131' and 235 and includes unpatterned layers 137 and 140. Structured film 402 includes patterned layer 235 and unpatterned layers 137 and 140.

In some embodiments, the first etching step includes reactive ion etching with a first etch gas (etch gas G1 in FIG. 2A) having a first composition, and the second etching step includes reactive ion etching with a second etch gas (etch gas G2 in FIG. 2A) having a different second composition. In some embodiments, each of the first and second etch gases includes at least one of oxygen, nitrogen trifluoride ($NF_3$), $CF_4$, $C_2F_6$, $C_3F_8$, $SF_6$, $Cl_2$, and $CH_4$. In some embodiments, the first etch gas includes at least one of oxygen, nitrogen trifluoride ($NF_3$), $CF_4$, $C_2F_6$, $C_3F_8$, $SF_6$, $Cl_2$, and $CH_4$, and the second etch gas includes at least one of oxygen, nitrogen trifluoride ($NF_3$), $CF_4$, $C_2F_6$, $C_3F_8$, $SF_6$, $C_2$, and $CH_4$ not included in the first etch gas. For example, the first etch gas can include oxygen and $Cl_2$ and the second etch gas can include oxygen and $CF_4$.

Etching (e.g., the first and/or second etching step) can be plasma etching. Where high aspect ratio structures are desired, ion-assisted plasma processing is conveniently used. Methods for achieving anisotropic etching include reactive ion etching (RIE), high density ion source processing, or a combination of high-density ion source processing along with RIE. High density plasmas can be generated by inductive radio-frequency, or microwave coupling, or by helicon ion sources. Linear high-density plasma sources are particularly advantageous for generating high aspect ratio features. Combining high density plasmas with RIE enables the decoupling of the ion generation (by high density plasma) from the ion energy (by RIE bias voltage).

The RIE method includes etching portions of a major surface not protected by a masking layer to form a structure (e.g., nanostructure) on the substrate. In some embodiments, the method can be carried out using a continuous roll-to-roll process referred to as "cylindrical reactive ion etching" (cylindrical RIE). Cylindrical RIE utilizes a rotating cylindrical electrode to provide anisotropically etched nanostructures on the surface of a substrate or article. In general, cylindrical RIE can be described as follows. A rotatable cylindrical electrode ("drum electrode") powered by radio-frequency coupling and a grounded counter-electrode are provided inside a vacuum vessel. The counter-electrode can comprise the vacuum vessel itself. An etchant gas is fed into the vacuum vessel, and a plasma is ignited and sustained between the drum electrode and the grounded counter-electrode.

A continuous substrate comprising a patterned masking layer can then be wrapped around the circumference of the drum and the substrate can be etched in the direction normal to the plane of the substrate. The exposure time of the substrate can be controlled to obtain a predetermined etch depth of the resulting nanostructure. The process can be carried out at an operating pressure of approximately 1-10 mTorr. Cylindrical RIE is described, for example, in U.S. Pat. No. 8,460,568 (David et al.).

The chemistry of the plasma environment can be controlled to achieve selectivity of etching, when multiple materials are present. Oxygen, and mixtures of oxygen with fluorinated gases are used to etch carbon containing materials such as polymers, diamond-like carbon, diamond, for example. The concentration of the fluorine in the plasma can be selected to optimize the etching rate and selectivity. Typically, a small amount of fluorinated gas is used to dramatically increase the etching rate of hydrocarbon polymers by as much as 300%.

To etch siliceous materials (silicon dioxide, $SiO_x$, diamond-like glass, silicon nitride, silicon carbide, silicon oxycarbide, polysiloxane, silsequioxane (SSQ) resins, etc), mixtures of fluorocarbons such as $CF_4$, $C_2F_6$, $C_3F_8$, for example, are used in combination with oxygen. The etch selectivity between siliceous materials and hydrocarbon polymers may be carefully tailored by obtaining the etching profiles of these materials as a function of the F/O atomic ratio in the plasma feed gas mixture. Oxygen rich conditions provide excellent selectivity of etching hydrocarbon polymers and diamond-like carbon (DLC) while using siliceous materials as the masking layer. In contrast, fluorine rich conditions provide excellent selectivity of etching siliceous materials while using hydrocarbon polymer-based masking materials.

Fluorinated plasma chemistries may be used for etching other masking materials such as tungsten, whose fluorides are volatile. Chlorine containing gas mixtures may be used to etch materials whose chlorides are volatile, such as aluminum, and titanium. Oxide, nitrides and carbides of these etchable metals can also be etched by using chlorine-based chemistries. Silicon nitride, aluminum nitride, and titanium oxide are high index materials that may be etched with chlorine chemistries.

The mask layer 131 can be made from any material having a suitable etch selectivity with the layer(s) 135. In some embodiments, the mask layer 131 is or includes a metal or a silicon-containing metal oxide. Examples include chromium (Cr), aluminum (Al), copper (Cu), titanium (Ti), tungsten (W), germanium (Ge), iridium (Ir), platinum (Pt), ruthenium (Ru), osmium (Os), rhenium (Re), alloys thereof, or silicon-containing oxides thereof. Metal nitrides or metal oxynitrides may also be used. In some embodiments, the mask layer 131 includes $SiO_2$, $Si_xO_yN_z$ ($x=1$, $y=1\sim2$, $z=0\sim1$), or $Si_xAl_yO_z$($x=1$, $y=0\sim1$, $z=1\sim2$). Since silicon is a metalloid, silicon oxides, silicon nitrides, and silicon oxynitrides are considered to be metal oxides, metal nitrides, and metal oxynitrides, respectively. Useful oxides are described in U.S. Pat. Appl. Pub. No. 2015/0214405 (Nachtigal et al.), for example. Useful materials include titanium nitride (TiN), aluminum oxide ($Al_2O_3$), aluminum and chromium (Al/Cr) metal alloys, $Si_xC_yH_z$($x=1$, $y=1\sim4$, $z=1\sim4$), or $Si_xC_yN_zH_n$ ($x=1$, $y=1\sim4$, $z=0\sim1$, $n=1\sim4$), $Si_xN_y$ ($x=1$, $y=0\sim1$), $SiO_x$ ($x=1\sim2$), $SiH_x$ ($x=1\sim4$), for example. In some embodiments, indium tin oxide (ITO) is used as a mask layer. Other suitable materials include diamond-like glass as described in U.S. Pat. No. 8,034,452 (Padiyath et al.), for example.

The etch stop layer 137 can be made from any material having a suitable etch selectivity with the layer(s) 135. In some embodiments, the etch stop layer 137 is or includes a metal (e.g., Cr, Al, Ti, Zr, Ta, Hf, Nb, Ce, or alloys thereof), a metal oxide (e.g., oxides of any of these metals such as $Al_2O_3$ or $Si_xAl_yO$, (e.g., $x=1$, $y=0\sim1$, $z=1\sim2$)); or $Si_xO_yN_z$ (e.g., $x=1$, $y=1\sim2$, $z=0\sim1$)), or a metal nitride (e.g., nitrides of any of these metals, or $Si_xO_yN_z$). In some embodiments, the etch stop layer 137 is or includes indium tin oxide, tin oxide, or alumina ($Al_2O_3$), for example. Useful materials include $Si_xC_yH_z$ (e.g., $x=1$, $y=1\sim4$, $z=1\sim4$), $Si_xC_yN_zH_n$ (e.g., $x=1$, $y=1\sim4$, $z=0\sim1$, $n=b$ $1\sim4$), $Si_xN_y$ (e.g., $x=1$, $y=0\sim1$), $SiO_x$ (e.g., $x=1\sim2$), $Si_xO_yN_z$ (e.g., $x=1$, $y=1\sim2$, $z=0\sim1$), or $SiH_x$ (e.g., $x=1\sim4$), for example. Other suitable materials include diamond-like glass, for example. In some embodiments, the etch stop layer 137 is optically transparent, which can be understood to mean that the etch stop layer has an average optical transmittance for substantially normally incident light of at least 60% for a wavelength range of 400 nm to 700 nm.

The average thickness of the mask layer 131 and/or the etch stop layer 137 may range from about 1 nm to about 200 nm, or from about 2 nm to about 50 nm, or from about 2.5 nm to about 10 nm, for example. The mask layer 131 can have an average thickness less than 50 nm, or less than 25 nm, and/or greater than 5 nm, for example. The etch stop layer 137 can have an average thickness less than 25 nm and/or greater than 2 nm, for example.

In some embodiments, the one or more unstructured layers 135 includes an inorganic material such as a metal oxide, nitride or oxynitride. In some embodiments, the one or more unstructured layers 135 includes a metal oxide. The metal oxide can be an oxide of Ti, Zr, Hf, Si, Nb, or Ta, for example. In some embodiments, the one or more unstructured layers 135 include a titania ($TiO_2$) layer. Titania may be preferred for optical applications involving visible light while other metal oxides may be used for applications involving near infrared light. In some embodiments, the one or more unstructured layers 135 includes a polymeric layer such as an acrylate (e.g., a crosslinked acrylate) layer.

In some embodiments, the etch resist layer 125 includes a silicone-containing polymer. In some embodiments, the etch resist layer 125 includes a siloxane, a silicone, or a silsesquioxane. In some embodiments, the etch resist layer 125 includes a crosslinked acrylate. Suitable etch resist layers are described in U.S. Pat. No. 5,811,183 (Shaw et al.), for example. The etch resist layer 125 may have a total thickness (full feature depth t2 plus thickness t1 of residual layer) in a range of 50 nm to 500 nm, for example.

In some embodiments, the one or more unstructured layers 135' includes first and second electrical conductor layers (e.g., layers 131 and 137) and a dielectric layer 135 disposed therebetween, where the first electrical conductor layer (e.g., layer 131) faces the etch resist layer 125. In some embodiments, etching into the one or more unstructured layers includes etching through the first electrical conductor layer (e.g., resulting in article 350 schematically illustrated in FIG. 3A). In some embodiments, etching into the one or more unstructured layers includes etching through the dielectric layer (e.g., resulting in article 351 schematically illustrated in FIG. 3B). In some embodiments, the pattern on the substrate is configured to provide passive cooling. For example, the pattern can define a metasurface thermal emitter as generally described in Miyazaki et al., "Dual-band infrared metasurface thermal emitter for $CO_2$ sensing", Applied Physics Letters 105, 121107 (2014) and Kumagai et al., "Kirchhoff's Thermal Radiation from Lithography-Five Black Metals", Micromachines 2020, 11, 824 (2020). In some embodiments, a structured article 350, 351 includes a first article having a first major surface 122 (e.g., the substrate 120 may be the first article) and a structured film 400, 401 disposed on the first major surface 122 and configured to provide passive cooling. The first article may generate heat (e.g., the first article may be an electronic device that generates heat when operated). The structured film 400, 401 includes a bonding layer 140 (e.g., an adhesive layer such as an organic and/or polymeric adhesive layer) bonding the structured film 400, 401 to the first major surface 122; a patterned electrical conductor layer 131'; an unpatterned electrical conductor layer 137 disposed between the bonding layer 140 and the patterned electrical conductor layer 131'; and a dielectric layer 135, 235 disposed between the patterned and unpatterned electrical conductor layers 131' and 137. The dielectric layer may be unpatterened (e.g., dielectric layer 135) or patterned (e.g., dielectric layer 235).

Figure 4A:
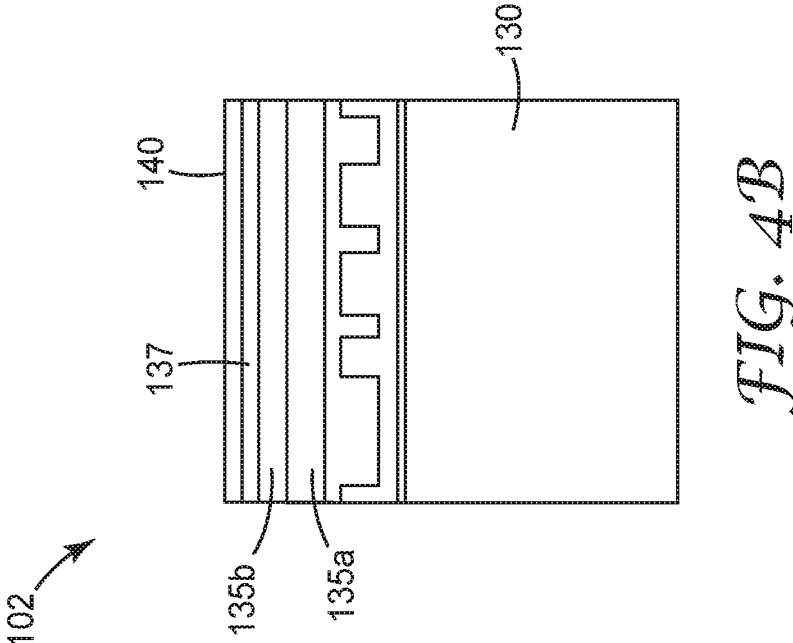
FIGS. 4A-4B are schematic cross-sectional views of illustrative structured films, according to some embodiments.
Figure 4B:
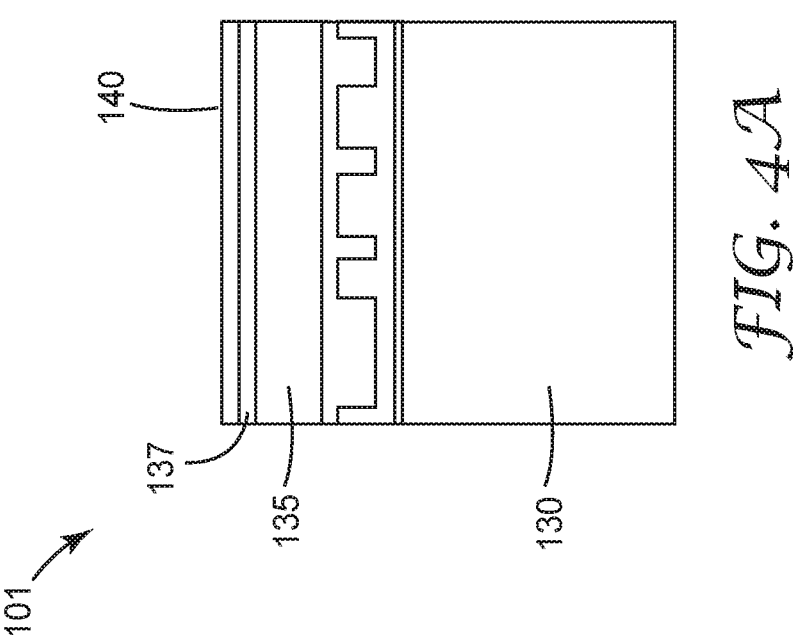

In some embodiments, one or both of the mask layer 131 and the etch stop layer 137 are omitted. FIGS. 4A-4B are schematic cross-sectional views of structured films 101 and 102, respectively, according so some embodiments. Structured film 101 may correspond to structured film 100 except that the mask layer 131 is omitted. Structured film 102 may correspond to structured film 100 except that the mask layer 131 is omitted and that the one or more unstructured layers 135 includes at least two unstructured layers 135a and 135b. The structured film 102 may optionally include the mask layer 131 with the at least two unstructured layers 135a and 135b. Etching into the one or more unstructured layers 135a, 135b may include etching through the one or more structured layers to the etch stop layer 137. The etch stop layer 137 may optionally be omitted from either structured film 101 or 102.

In some embodiments, the one or more unstructured layers includes at least one of an inorganic layer and a polymeric layer. For example, the layer 135 may be an inorganic layer such as a metal oxide layer, or the layer 135 can be a polymeric layer such as an acrylate layer. As another example, one of the unstructured layers 135a and 135b illustrated in FIG. 4B may be a polymeric layer and the other of the unstructured layers 135a and 135b may be an inorganic layer. Polymeric layers can be understood to be organic polymeric layers, unless indicated differently. In some embodiments, the one or more unstructured layers includes at least one layer being one or more of an inorganic layer, a metal oxide layer, a polymeric layer, a fluoropolymer layer, a dielectric layer, an electrically conductive layer, or a metal layer. In some embodiments, the one or more unstructured layers includes at least one electrically conductive layer and at least one dielectric layer. For example, layer 135 of the one or more unstructured layers 135' may be a dielectric layer which may be a metal oxide or a polymeric layer, for example, and one or both of the layers 131 and 137 of the one or more unstructured layers 135' can be an electrically conductive layer such as a metal layer. In some embodiments, the one or more unstructured layers 135' includes first and second electrically conductive layers (e.g., layers 131 and 137) and an electrically insulative layer (e.g., layer 135) disposed therebetween. Suitable materials for the electrically conductive layers include metals such as gold, silver, copper, aluminum, and alloys thereof, for example.

Figure 5A:
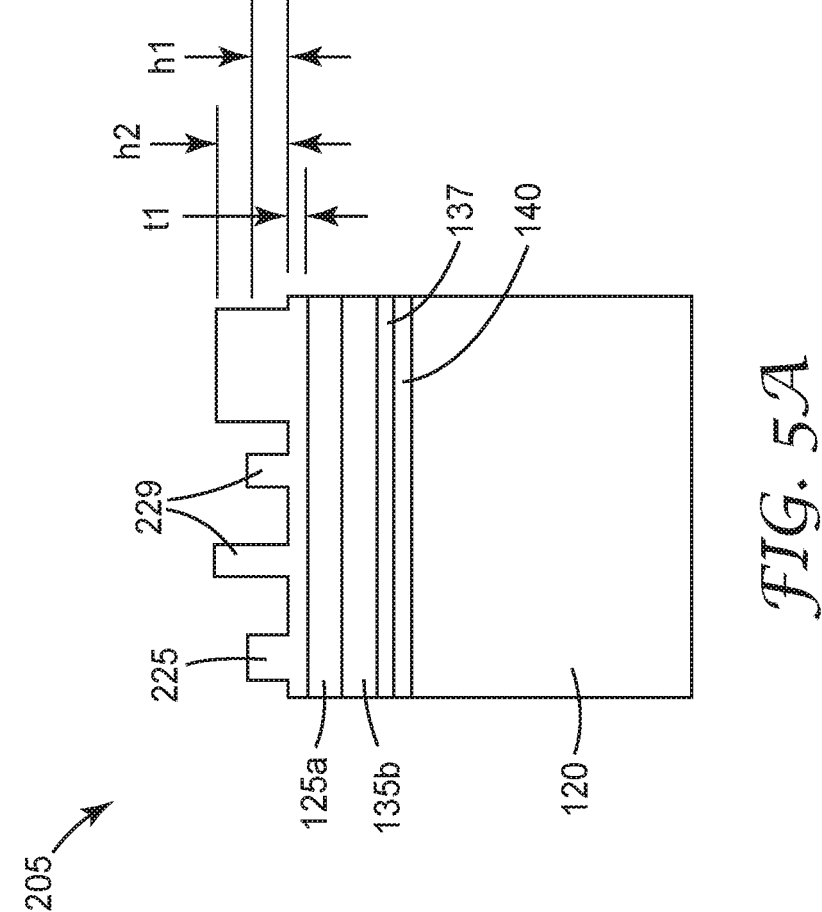
FIG. 5A is a schematic cross-sectional view of an article including an etch resist layer having structures with two different heights, according to some embodiments.

In some embodiments, the plurality of engineered structures 129 includes at least two different heights h1 and h2. FIG. 5A is a schematic cross-sectional view of an article 205 which may generally correspond to article 105 shown in FIG. 2. The etch resist layer 225 includes engineered structures 229 having two different heights h1 and h2. The etch resist layer 225 includes a residual layer having a thickness t1. Structures having at least two different heights are useful in thin film transistor applications, for example, as generally described in U.S. Pat. No. 6,861,365 (Taussig et al.) and U.S. Pat. No. 7,521,313 (Mea), for example.

Figure 5B:
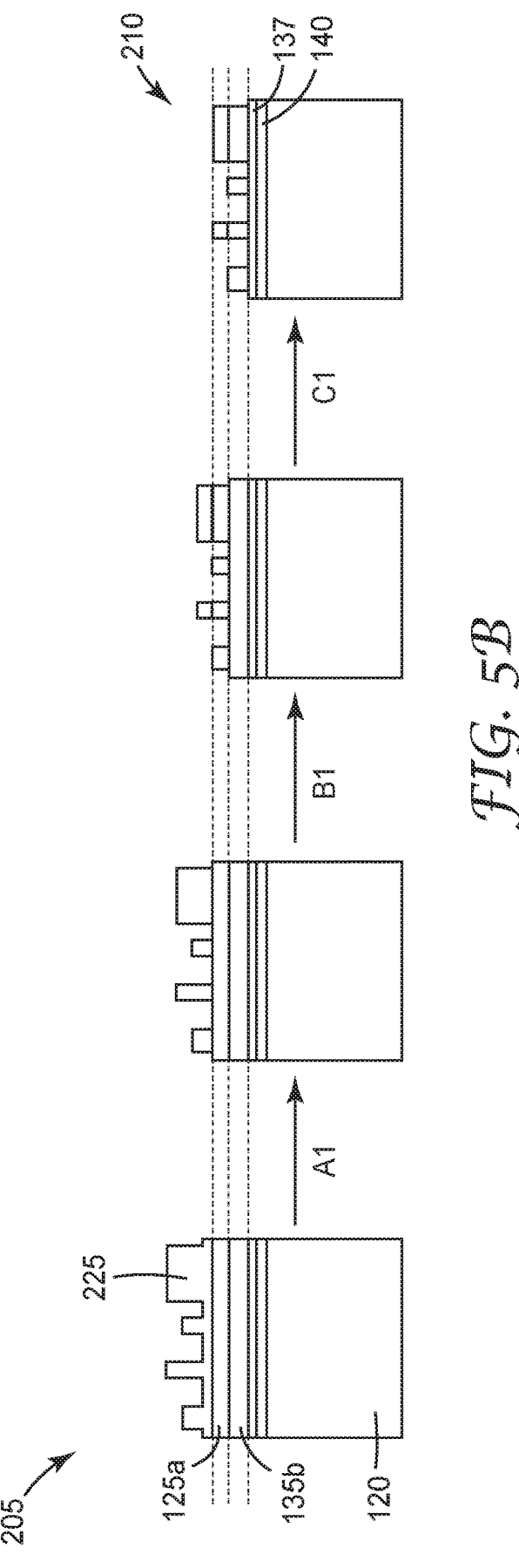
FIG. 5B is a schematic illustration of a method of forming a pattern on a substrate by etching through the etch resist layer of the article of FIG. 5A.

FIG. 5B is a schematic illustration of a method of forming a pattern 210 on a substrate 120 by etching through the etch resist layer 225 into the one or more unstructured layers 135a, 135b. In step A1, a "breakthrough" etch is used to etch through the residual layer of the etch resist layer 225. In step B1, the layer 135a is etched. In step C1, the layer 135b is etched. The steps A1, B1, and C1 may be carried out using different etching conditions for the different steps. For example, reactive ion etching can be used in each step where different etch gases having different compositions are used in the different steps.

In some embodiments, the one or more unstructured layers includes a plurality of unstructured layers (e.g., layers 135a and 135b, or layer 135 and at least one of layers 131 and 137). In some embodiments, etching into the one or more unstructured layers includes etching into at least one of the plurality of unstructured layers, but not etching into at least one other of the plurality of unstructured layers. For example, layer 131 may be etched to form layer 131' depicted in FIG. 3A without etching into layer 135. In some embodiments, etching into the one or more unstructured layers includes etching into each layer of the plurality of unstructured layers. For example, the one or more unstructured layers may be layers 135 and 131 and the method for forming the pattern may include etching into each of these layers as schematically illustrated in FIG. 3B, for example. As another example, the one or more unstructured layers can be layers 135a and 135b and the method may include etching into each of these layers into as schematically illustrated in FIG. 5B, for example. In some embodiments, etching into layer(s) includes etching through the layer(s), such as etching through the layer(s) to an etch stop layer to form the pattern (e.g., pattern 110), for example.

Figure 5C:
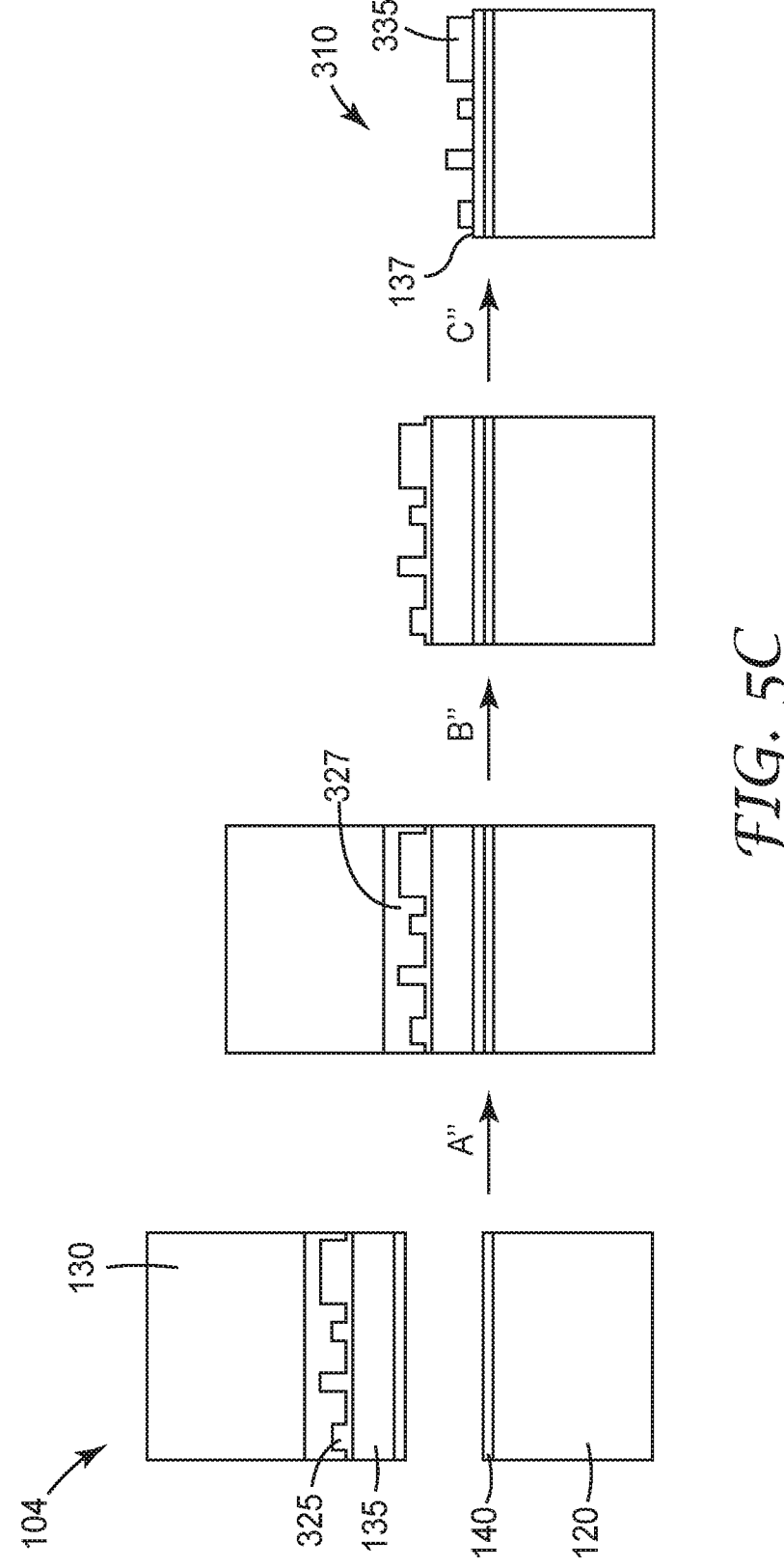
FIG. 5C is a schematic illustration of a method of forming a pattern including engineered structures having multiple heights on a substrate.

In some embodiments, a monolithic layer is structured to include features having multiple (at least two) heights. Having different feature heights is useful in waveguide extraction, for example, to provide improved light extraction uniformity, for example. FIG. 5C is a schematic illustration of a method of forming a pattern 310 on a substrate 120 by etching through the etch resist layer 325 into the unstructured layers 135. An adhesive layer 140 is applied to the substrate 120 and then in step A" a structured film 104 is bonded to the substrate 120. The structured film 104 includes etch resist layer 325 and structured resin layer 327. An interface between the etch resist layer 325 and the structured resin layer 327 includes engineered structures having at least two different heights. In step B", the polymeric support layer 130 and the structured resin layer 327 are removed. In step C", the layer 135 is etched through the etch resist layer 325 to form engineered structures 335.

Figure 6:
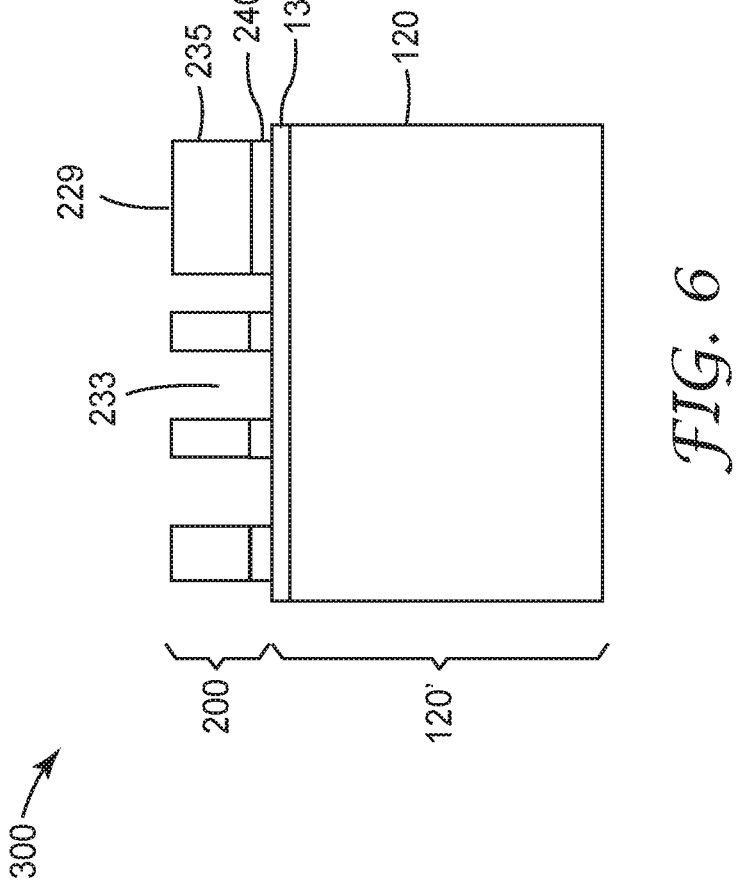
FIG. 6 is a schematic cross-sectional view of an article including a structured film disposed on a substrate, according to some embodiments.

In some embodiments, the etch stop layer 137 is omitted from the structured film (100 or 100' or other structured film described herein). In some such embodiments, the substrate includes an etch stop layer. FIG. 6 is a schematic cross-sectional view of an article 300 including a structured film 200 disposed on a substrate 120'. The substrate 120' includes an etch stop layer 137 disposed on a substrate 120. Alternatively, the substrate 120 can be made of a material that functions as an etch stop so that layer 137 can be omitted. The structured film 200 includes a patterned layer 235 and an adhesive layer, which is also patterned, bonding the structured film 200 to the substrate 120'. The article 300 can be made using the processes schematically illustrated in FIGS. 2A-2B except that the film 100, 100' would not include the etch stop layer 137 which would instead be disposed on a major surface of the substrate 120, or defined by the substrate 120, prior to applying the structured film 100.

Any of the articles of the present description (e.g., 150, 300, 350, 351, or 352) may be an optical article, such as an article adapted to be used in an optical application (e.g., to transport or extract light) or such as an intermediate article that upon further processing (e.g., etching) is adapted to be used in an optical application. The substrate 120 may be or include a waveguide, or a waveguide may be or include the substrate 120. The waveguide may be a glass waveguide or a polymeric (e.g., polymethylmethacrylate) waveguide, for example. The waveguide may be an image preserving waveguide (e.g., a waveguide such that when a light containing an image (e.g., light from a display) propagates along the waveguide and is then extracted from the waveguide, the extracted light retains the image), for example. In some embodiments, a waveguide combiner includes the waveguide and the structures formed on the substrate which define optical metasurface input and/or output couplers. Waveguide combiners are described in Kress, "Optical waveguide combiners for AR headsets: features and limitations", Proc. SPIE 11062, Digital Optical Technologies 2019, 110620J (16 Jul. 2019); doi: 10.1117/12.2527680, for example.

The engineered structures can be used as surface relief gratings (SRGs), for example. An SRG, as the term is used herein, includes the case where the grating is embedded in a material having a different refractive index. In some embodiments, the structured surface of the SRG is exposed (e.g., to air). The structures can be used for optical incoupling and/or outcoupling (e.g., to augmented reality waveguide elements), for example. Alternatively, or in addition, the structures may be used for exit pupil expansion in augmented reality waveguide elements, as a light distribution element, an orthogonal pupil expander, or a redirecting element, for example. Illustrative examples of the use of SRGs in image preserving waveguides can be found in International Pat. Appl. Pub. No. WO 2019/195186 (Peroz et al.), for example.

In some embodiments, the layer 140 may be an optical bonding layer (e.g., an optically clear adhesive layer) having a refractive index having an imaginary part (x) less than 0.1, or less than 0.05, or less than 0.03, or less than 0.01, or less than 0.005 for at least a first wavelength W1 and has an average thickness ta greater than 5 nm and less than ¼ W1. The first wavelength W1 can be any wavelength of interest such as a visible wavelength (400 nm to 700 nm) or a near infrared wavelength (700 nm to 2500 nm). The average thickness ta can be less than 0.2, or less than 0.15, or less than 0.1, times the first wavelength W1, or the average thickness ta can be in any range described elsewhere herein.

In some embodiments, the substrate 120 is a waveguide and an optical article is provided that includes a structured film disposed on the waveguide. In some embodiments, an optical article 150 (see, e.g., FIG. 2A) includes a waveguide 120 and the structured film 100 disposed the waveguide 120, where the adhesive layer 140 bonds the structured film 100 to the waveguide 120.

In some embodiments, an optical article 300 (see, e.g., FIG. 6) includes a substrate 120, an optically transparent etch stop layer 137 disposed on the substrate 120, a structured film 200 disposed on the etch stop layer 137. The structured film 200 includes one or more patterned layers 235 and an adhesive layer 240 bonding the one or more patterned layers 235 to the etch stop layer. The structured film 200 includes a plurality of structures 229 defining a plurality of gaps 233 separating adjacent structures, where at least some (e.g., greater than 50%, or greater than 70%, or greater than 80%, or greater than 90%, or all or substantially all) of the gaps 233 extend through the structured film 200 to the etch stop layer 137. The one or more patterned layers 235 can be formed by patterning one or more unstructured layers which may have optical properties (e.g., transmittance) as described further elsewhere herein. In some embodiments, the one or more patterned layers 235 includes a patterned inorganic layer. In some embodiments, each layer of the one or more patterned layers 235 is a patterned inorganic layer.

In some embodiments, an optical article (e.g., articles 350, 351, 352 schematically illustrated in FIGS. 3A-3C) includes a waveguide 120 and a structured film 400, 401, 402 disposed on the waveguide. In some embodiments, the structured film 400, 401, 402 includes an optical bonding layer 140 bonding the structured film 400, 401, 402 to the waveguide 120, and one or more patterned layers 131' and/or 235 disposed on the optical bonding layer 140. The one or more patterned layers 131' and/or 235 is formed by patterning one or more unstructured layers 131 and/or 135 (or layers 135a and 135b schematically illustrated in FIGS. 5A-5B, for example), where the one or more unstructured layers has an optical transmittance for substantially normally incident light of at least 50% for at least a first wavelength W1 in a range of 400 nm to 2500 nm. The structured film can include an etch stop layer 137 disposed between the one or more patterned layers and the optical bonding layer 140. In some embodiments, the etch stop layer 137 has an optical transmittance for substantially normally incident light of at least 50% for at least the first wavelength W1.

In some embodiments, the wavelength(s) of interest are in a visible or near-infrared range. Accordingly, the first wavelength W1 can be in the range of 400 nm to 2500 nm. In some embodiments, visible wavelengths are of primary interest. Accordingly, the first wavelength W1 can be in the range of 400 nm to 700 nm. In some embodiments, near-infrared wavelengths are of primary interest. Accordingly, the first wavelength W1 can be in the range of 700 nm to 2500 nm or 800 nm to 2000 nm, for example. Some specific near-infrared wavelengths that may be of interest depending on the application include 850 nm, 905, nm, 940 nm, 1060 nm, 1330 nm, and 1550 nm, for example.

The one or more patterned layers can include any of the materials described elsewhere for the one or more layers 135. In some embodiments, the one or more patterned layers is or includes one or more patterned inorganic layers. In some embodiments, the one or more patterned layers includes silicon (e.g., the one or more patterned layers can include one or more silicon layers). In some embodiments, the one or more patterned layers can include a metal oxide (e.g., the one or more patterned layers can include one or more metal oxide layers). In some embodiments, the one or more patterned layers includes titania (e.g., the one or more patterned layers can include one or more titania layers).

The etch stop layer 137 may be selected from materials having a desired optical transmittance at a wavelength of interest for a suitable thickness. In some embodiments, the etch stop layer 137 has an optical transmittance for substantially normally incident light of at least 60%, or at least 70% for at least the first wavelength W1. In some embodiments, the one or more unstructured layers has an optical transmittance for substantially normally incident light of at least 60%, or at least 70% for at least the first wavelength W1.

Figure 7:
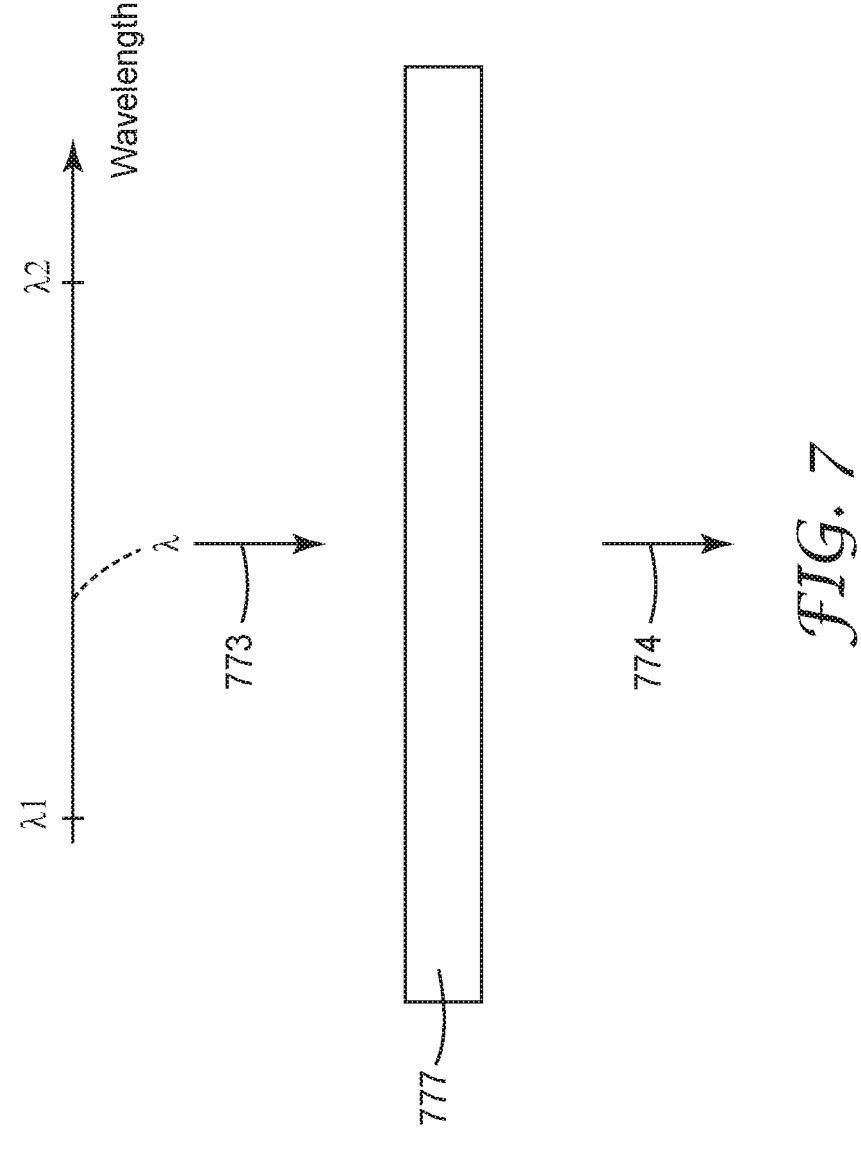
FIG. 7 is a schematic cross-sectional view illustrating light incident on one or more unstructured layers, according to some embodiments.

FIG. 7 is a schematic cross-sectional view illustrating one or more unstructured layers 777, an incident light 773, and a transmitted light 774. The incident light 773 is substantially normally (e.g., within 20 degrees, or within 10 degrees, or within 5 degrees of normal) incident on the one or more unstructured layers 777 which can be a single layer (e.g., corresponding to any one of layers 131, 135 or 137) or can be a stack of layers (e.g., corresponding to layers 131, 135 or layers 135a, 135b). The incident light 773 is schematically represented as having wavelength λ in a range of λ1 to λ2. The range from λ1 to λ2 may be from 400 nm to 2500 nm, or 400 nm to 700 nm, or 700 nm to 2500 nm, for example. The wavelength λ may be a single wavelength (e.g., the first wavelength W1) or a range of wavelengths (e.g., 400 nm to 700 nm). In some embodiments, the one or more unstructured layers 777 can have an optical transmittance for substantially normally incident light of at least 60%, or at least 70%, or at least 80% for at least a first wavelength W1. In some embodiments, the one or more unstructured layers 777 can have an average optical transmittance (unweighted mean of optical transmittance over a given wavelength range) of for substantially normally incident light of at least 50%, or at least 60%, or at least 70%, or at least 80% for a wavelength range of 400 nm to 2500 nm or 400 nm to 700 nm, for example.

EXAMPLES

A structured film article is prepared by using nanoreplication, solvent coating, and vacuum thin film deposition methods. The resultant construction is a lamination transfer film capable of delivering lithographic functional layers (patterned resist, hard mask, and etch stop layers) and an unpatterned optical functional layer (titanium dioxide) to a receptor substrate such as a polished glass sheet.

These examples are merely for illustrative purposes only and are not meant to be limiting. All parts, percentages, ratios, etc. in the examples and the rest of the specification are by weight, unless noted otherwise. Solvents and other reagents used are obtained from Sigma-Aldrich Chemical Company, St. Louis, Missouri unless otherwise noted.

Materials

| Designation | Description | Source |
|---|---|---|
| PHOTOMER 6210 | Urethane acrylate oligomer available under the trade designation PHOTOMER 6210 | IGM Resins, Charlotte, NC, United States |
| SR238 | 1,6-hexanediol diacrylate available under the designation SR238 | Sartomer Americas, Exton, PA, United States |
| SR351 | Trimethylolpropane triacrylate available under the designation SR351 | Sartomer Americas, Exton, PA, United States |
| TPO | Diphenyl(2,4,6-trimethylbemzoyl)phosphine oxide available under the trade designation IRGACURE TPO | BASF, Florham Park, NJ, United States |
| TTIP | Titanium tetra(isopropoxide) | Sigma-Aldrich Corporation, St. Louis, MO, United States |
| FG1901 G | a high molecular weight maleated styrene-butadiene-styrene available under the trade designation KRATON FG1901 G | Kraton Polymers LLC, Houston, TX, United States |
| PF-5060 | Fully-fluorinated liquid ($C_6F_{14}$) available under the designation PF-5060 | 3M Company, St. Paul, MN, United States |
| $O_2$ | Oxygen (UHP compressed gas) | Oxygen Service Company, St. Paul, MN, United States |
| $N_2$ | Nitrogen (UHP compressed gas) | Oxygen Service Company, St. Paul, MN, United States |
| Ar | Argon (UHP compressed gas) | Oxygen Service |

-continued

| Designation | Description | Source |
|---|---|---|
| | | Company, St. Paul, MN, United States |
| $Cl_2$ | Chlorine (UHP compressed gas) | Oxygen Service Company, St. Paul, MN, United States |
| $SF_6$ | Sulfur Hexafluoride (UHP compressed gas) | Oxygen Service Company, St. Paul, MN, United States |
| ST504 | Polyester film available under the trade designation MELINEX ST504 | Du Pont Teijin Films, Chester, VA, United States |
| Polycarbonate Film | 125-micrometer thick polycarbonate film with a gloss surface finish on both sides | Tekra, Inc., New Berlin, WI, United States |
| Glass wafer | 1.1 mm thick by 76.2 mm diameter Glass wafers sold under the designation Eagle XG | Coresix Precision Glass, Inc., Williamsburg, VA, United States |

Preparatory Examples

Preparatory Example 1 (Resin D)

An acrylate resin mixture prepared by combining and mixing PHOTOMER 6210, SR238, SR351 and TPO in weight ratios of 60/20/20/0.5.

Prophetic Example 1

A structured film article is formed by the following steps:

Step 1. Nanoreplication of Template Layer

A nano-featured template film is prepared by die coating Resin D onto a polycarbonate film. The coated film is pressed against a nanostructured nickel surface attached to a steel roller controlled at 60° C. using a rubber covered roller at a speed of 15.2 meters/min. The nanostructured nickel surface consists of twelve 6 mm by 6 mm patterned areas with features ranging in size between 75 nm and 500 nm. The patterned area consisted of a multi-pitch pattern with pitches of 150, 200, and 250 nm with feature widths of half the pitch (75, 100, 125 nm).

The features are arranged in a square grid so that pitches are varied in both axes resulting in a nine unit repeating cell with rectangles of all combinations of widths mentioned above. In this repeating cell, the 150 nm pitch sections have 27 features, the 200 nm pitch sections have 20 features and the 250 nm pitch sections have 16 features. The features are about 200 nm tall and have side wall angles of approximately 4 degrees.

The coating thickness of Resin D on the film is sufficient to fully wet the nickel surface and form a rolling bead of resin as the coated film is pressed against the nanostructured nickel surface. The film is exposed to radiation from two Fusion UV lamp systems (obtained under the trade designation "F600" from Fusion UV Systems, Gaithersburg, MD) fitted with D bulbs both operating at 142 W/cm while in contact with the nanostructured nickel surface. After peeling the film from the nanostructured nickel surface, the nano-structured side of the film is exposed again to radiation from the Fusion UV lamp system.

Step 2. Solvent Coating of Resist Layer

A solvent-based resin is coated onto a section of the nano-featured template film produced in Step 1 using a slot-type coating die in continuous film coating apparatus. The resin is selected to be compatible with and act as a resist for the plasma etching processes. After coating, the coated web travels approximately 2.4 m (8 ft) before entering a 9.1 m (30 ft) conventional air floatation drier with all 3 zones set at 65.5° C. (150° F.). The dried resin layer fills and planarizes the underlying nano-featured template layer.

Step 3. Vacuum Deposition of Hard Mask Layer

A hard mask layer is formed by sputter-depositing a 15 nm thick Cr layer on to the resist coated web surface in a roll-to-roll process. One direct current (DC) power supply is used to control a cathode housing one Cr target commercially available from Soleras Advanced Coatings of Spring Green, WI. The DC power supply drives a magnetron plasma on the Cr target with a gas environment containing Ar at a sputter pressure in the range of 1-5 millitorr. The resist coated web surface is rotated past the cathode at a speed appropriate to deposit 15 nm thick Cr layer atop the resist layer discussed above.

Step 4. Vacuum Deposition of Titanium Dioxide Layer

A thin film of $TiO_2$ is formed from Titanium tetra(iso-propoxide) (TTIP) on the hard mask layer of the film from the previous step using a spatial atomic layer deposition (ALD) process. The planar coating is performed in a spatial roll-to-roll ALD machine as described by U.S. Pat. Appl. Pub. No. 2019/0112711 (Lyons et al.). $TiO_2$ is deposited using TTIP heated to 80° C. with 300 sccm $N_2$ push gas, and a plasma discharge of approximately 0.50 $mA/cm_2$ in an environment of 1.1 torr $N_2$ and 0.3 torr $CO_2$. The ALD chamber is heated to 100° C.

The film is translated through the ALD chamber for a plurality of passes at 30.48 meters/min (100 ft/min), with one precursor exposure and one plasma exposure per ALD cycle, and 72 ALD cycles per chamber pass. The film is translated through the ALD chamber up to 50 passes to yield a $TiO_2$ layer thickness of approximately 200 nm.

Step 5. Vacuum Deposition of Etch Stop Layer

An etch-stop layer is formed by sputter-depositing an $AlO_x$ layer atop the $TiO_2$ layer formed in the previous step.

One alternating current (AC) power supply is used to control a cathode housing two A1 targets commercially available from Soleras Advanced Coatings of Spring Green, WI. During sputter deposition, the voltage signal from each power supply is used as an input for a proportional-integral-differential control loop to maintain a predetermined oxygen flow to each cathode. The AC power supply drives a magnetron plasma on the A1 targets using 5000-16000 watts of power, with a gas mixture containing argon and oxygen at a sputter pressure in the range of 1-5 millitorr. The $TiO_2$-coated web surface is rotated past the cathode at a speed appropriate to deposit 12 nm thick $AlO_x$ layer atop the $TiO_2$ layer discussed above.

Step 6. Solution Coating of Adhesive Layer

An adhesive layer is formed on the surface of the aforementioned etch stop layer by slot die coating an adhesive coating solution in a roll-to-roll process. The adhesive coating solution is made by diluting a quantity of FG1901 G in sufficient cyclohexane to produce a solution containing 0.33% wt. total solids. The solution is coated onto the film from Step 5 at a speed and flow rate to produce a wet coating thickness of about 9 micrometers. The coated web travels approximately 2.4 m (8 ft) before entering a 9.1 m (30 ft) conventional air floatation drier with all 3 zones set at 80° C. (176° F.). After drying, the adhesive coating thickness is about 30 nanometers.

Prophetic Example 2

A laminated article is formed by laminating the structured film article of Prophetic Example 1 to a glass substrate. A suitable glass substrate is 1.1 mm thick, 76.2 mm diameter Eagle XG glass wafer. The film is laminated to the glass substrate by placing the adhesive side of the structured film on to one surface of the glass wafer and passing them through an HL-100 Hot Roll Laminator (ChemInstruments, West Chester Township, OH) set to 80 psi, 40 cm/min, and 115° C.

Prophetic Example 3

A patterned substrate is formed by further processing of the laminated article of Prophetic Example 2. The nano-featured template layer is separated from the resist layer by peeling the polycarbonate substrate along with the structured layer away from the glass wafer, causing the nano-featured template layer to separate from the patterned resist resin layer.

Reactive ion etching is performed in a Plasmatherm790 (Plasmatherm, Saint Petersburg, FL) configured with an inductively coupled source and a capacitively coupled electrode. After placing the patterned glass wafer on the powered electrode, the reactor chamber is pumped down to a base pressure of less than 1.3 Pa (1 mTorr).

A $1^{st}$ etch step removes the residual land area from the nanostructured resin of Step 2 in Prophetic Example 1. PF-060 gas and $O_2$ gas is flowed into the chamber at a rate of 30 SCCM and 15 SCCM, respectively. 13.56 MHz radiofrequency (RF) power is coupled into the capacitively coupled electrode at 500 W. The plasma treatment is applied for 2 to 200 seconds using the minimum treatment time required to remove the land area of the nanostructured resist.

After the $1^{st}$ etch step is completed, the RF power is turned off and gasses are evacuated from the chamber. In a second etching step, $Cl_2$ gas and $O_2$ gas are flowed into the reactor at rates of 38 SCCM and 2 SCCM, respectively. The pressure is held to 150 mTorr and the capacitive RF power is applied at 350 W. The plasma treatment is applied for 15 to 60 seconds to transfer the pattern in the chrome hard mask layer.

When the second etch step is complete, the RF power is turned off and gasses are evacuated from the reactor. Following the second etch, the $TiO_2$ layer is etched in a third reactive ion etching treatment carried out in the same reactor without returning the chamber to atmospheric pressure. $SF_6$ gas and Ar are flowed into the chamber at rates of 10 SCCM and 5 SCCM, respectively. 2 MHz RF power is coupled into the inductively coupled coil at 500 W and 13.56 MHz RF power is coupled into the capacitively coupled electrode at 250 W. The plasma is applied for an exposure time of 80 to 150 seconds in order to transfer the pattern layer into the $TiO_2$ layer without penetrating the etch stop layer. At the end of this treatment time, the RF power and the gas supply are stopped, and the chamber is returned to atmospheric pressure.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations, or variations, or combinations of the specific embodiments discussed herein. Therefore, it is intended that this disclosure be limited only by the claims and the equivalents thereof.

What is claimed is:

1. A structured film for forming a pattern on a substrate, the structured film comprising:

a polymeric support layer;

an adhesive layer;

an etch resist layer disposed between the polymeric support layer and the adhesive layer;

a structured resin layer disposed between the polymeric support layer and the etch resist layer, the structured resin layer comprising a structured major surface comprising a plurality of engineered structures, the etch resist layer at least partially filling spaces between adjacent engineered structures to substantially planarize the structured major surface; and a dynamic separating layer disposed between the structured resin layer and the polymeric support layer; and one or more unstructured layers having a total thickness of less than 10 microns and disposed between the etch resist layer and the adhesive layer.

2. The structured film of claim 1, wherein the structured resin layer is permanently attached the etch resist layer.

3. The structured film of claim 1, wherein the dynamic separating layer comprises a light-to-heat conversion layer.

4. The structured film of claim 1, wherein the etch resist layer comprises a residual layer between a substantially unstructured major surface of the etch resist layer and the plurality of engineered structures, a ratio of an average thickness of the residual layer to an average height of plurality of engineered structures being less than 1.

5. The structured film of claim 1, wherein the plurality of engineered structures comprises at least two different heights.

6. The structured film of claim 1, wherein the plurality of engineered structures comprises a plurality of nanostructures.

7. The structured film of claim 1, wherein the one or more unstructured layers comprises at least two unstructured layers.

8. The structured film of claim 1 further comprising an additional polymeric layer disposed between the dynamic separating layer and the structured resin layer, wherein the dynamic separating layer is adapted to be releasably attached to the additional polymeric layer upon activation.

* * * * *